United States Patent
Isogai et al.

(10) Patent No.: US 6,651,316 B2
(45) Date of Patent: Nov. 25, 2003

(54) APPARATUS FOR AUTOMATICALLY RESETTING PRINTED-CIRCUIT-BOARD HOLDING DEVICE

(75) Inventors: Takeyoshi Isogai, Hekinan (JP); Noriaki Iwaki, Hekinan (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 35 days.

(21) Appl. No.: 09/915,579

(22) Filed: Jul. 27, 2001

(65) Prior Publication Data

US 2002/0014732 A1 Feb. 7, 2002

(30) Foreign Application Priority Data

Aug. 4, 2000 (JP) ........................................ 2000-237422

(51) Int. Cl.⁷ ................................................. H05K 3/30
(52) U.S. Cl. ............................. 29/739; 29/740; 29/743; 414/222.05
(58) Field of Search ................... 29/740, 743, 739, 29/759, 760, 744; 294/2, 64.1; 414/222.05, 225.01, 222.06, 783; 269/13, 152, 224, 25, 903

(56) References Cited

U.S. PATENT DOCUMENTS

| | | |
|---|---|---|
| 5,794,329 A | 8/1998 | Rossmeisl et al. |
| 5,932,065 A | 8/1999 | Mitchell |
| 5,933,942 A * | 8/1999 | Kitamura et al. ............. 29/740 |
| 6,212,751 B1 * | 4/2001 | Hattori .................... 29/407.04 |
| 2002/0021953 A1 * | 2/2002 | Isogai et al. ........... 414/222.05 |

FOREIGN PATENT DOCUMENTS

| | | |
|---|---|---|
| EP | 0 929 209 A2 | 7/1999 |
| JP | 7-15189 A | 1/1995 |
| JP | 7-93520 B2 | 10/1995 |
| JP | 2792931 B2 | 6/1998 |
| JP | 2824378 B2 | 9/1998 |
| JP | 11-195899 A | 7/1999 |

OTHER PUBLICATIONS

U.S. patent application Ser. No. 09/915,536, Isogai et al., filed Jul. 27, 2001.

U.S. patent application Ser. No. 09/915,383, Isogai et al., filed Jul. 27, 2001.

U.S. patent appiication Ser. No. 09/892,516, Iwaki, filed Jun. 28, 2001.

* cited by examiner

Primary Examiner—Carl J. Arbes
Assistant Examiner—Minh Trinh
(74) Attorney, Agent, or Firm—Oliff & Berridge, PLC

(57) ABSTRACT

An apparatus for automatically resetting a printed-wiring-board supporting device including a supporting table and a plurality of supporting members which are set on a surface of the supporting table to support a back surface of a printed wiring board, the apparatus including a supporting-member storing device in which the supporting members are stored, a holding head which can hold each of the supporting members, a moving device which moves the holding head relative to each of the supporting table and the storing device, in a direction parallel to the surface of the supporting table, so that the holding head takes a prescribed one of the supporting members from the storing device and sets the supporting member at a prescribed setting position on the surface of the supporting table, and takes the supporting member from the setting position and stores the supporting member in the storing device, and a control device which controls the moving device.

4 Claims, 19 Drawing Sheets

FIG. 14

| PIN NUMBER np | PIN-SETTING INFORMATION |
|---|---|
| 1 | HOLDING PIN (X1, Y1, $\theta 1$) |
| 2 | CLOSING PIN (X2, Y2, $\theta 2$) |
| 3 | CLOSING PIN (X3, Y3, $\theta 3$) |
| ⋮ | ⋮ |
| np-1 | CLOSING PIN (Xnp-1, Ynp-1, $\theta$ np-1) |
| np | HOLDING PIN (Xnp, Ynp, $\theta$ np) |

APPARATUS FOR AUTOMATICALLY RESETTING PRINTED-CIRCUIT-BOARD HOLDING DEVICE

BACKGROUND OF THE INVENTION

1. Field of the Invention

The present invention relates to the art of resetting a printed-wiring-board supporting device which supports a printed wiring board (PWB), and particularly relates to the art of shortening a time needed to reset the PWB supporting device. A PWB with electric components (e.g., electronic components) being mounted thereon should be called as a printed circuit board (PCB) but, in the present specification, a PCB is also referred to as a PWB, for avoiding complexity.

2. Discussion of Related Art

Generally, a PWB includes a thin substrate formed of an electrically insulating material such as a synthetic resin, and a circuit pattern formed of an electrically conductive material on the thin substrate. Thus, the PWB has flexibility. Therefore, when electric components (ECs) are mounted on the PWB, or when an adhesive or a creamed solder is applied to the PWB for mounting of ECs, the PWB cannot maintain an accurate flatness, unless a back surface of the PWB is supported at a considerably large number of points.

To solve this problem, Japanese Patent Document No. 7-15189 teaches applying a negative pressure or suction to a PWB and thereby holding the same. More specifically described, the document discloses a PWB holding device including a base plate and a plurality of holding pins. The base plate has a plurality of negative-pressure-supply holes each of which opens in an upper surface thereof and is connected via a negative-pressure passage formed therein to a negative-pressure-supply source. Each of the holding pins includes an elongate pin portion and a container-like seat portion, and the pin portion has a passage which is formed therethrough in an axial direction thereof and is communicated with an inner space of the seat portion. Each holding pin is attached to the upper surface of the base plate, such that a lower-end surface of the seat portion thereof is held in close contact with a portion of the upper surface that surrounds the opening of one negative-pressure-supply hole. In this state, the inner passage of the pin portion is communicated with the negative-pressure-supply hole via the inner space of the seat portion, so that negative pressure is supplied to the inner passage and is applied to a lower or back surface of a PWB to support the same. Thus, the PWB holding device is a PWB supporting device which has the function of sucking and holding a PWB.

The holding pins support the back surface of the PWB that is opposite to the front surface for which an operation, such as mounting of ECs, is performed. However, the holding pins must not engage uneven portions of the back surface of the PWB itself or the ECs mounted on the back surface. Therefore, the holding pins must be engaged with only limited portions of the back surface of the PWB and, depending upon those limited portions of the back surface, the holding pins must be attached to only limited portions of the upper surface of the base plate. Thus, the holding pins are attached to selected ones of the negative-pressure-supply holes of the base plate, and the remaining supply holes to which the holding pins are not attached are closed with respective caps to avoid the leakage of negative pressure.

However, conventionally it is an operator who sets the holding pins on the base plate and attaches the caps to the negative-pressure-supply holes free of the holding pins, and accordingly it takes a long time to reset the PWB holding device. When a current sort of PWBs are changed to a new sort of PWBs for each of which an operation is to be performed, the PWB holding device is reset by moving the holding pins from the current positions to new positions to support the new sort of PWBs. However, this resetting operation needs a long time.

This problem occurs to not only a PWB supporting device which includes holding pins each for applying negative pressure to a PWB and thereby holding the same but also a PWB supporting device which does not have the function of applying negative pressure to a back surface of a PWB and thereby holding the same but includes closing-pins each for supporting, at a support surface thereof, a back surface of a PWB and thereby supporting the same. The latter PWB supporting device does not require the operator to attach caps to negative-pressure-supply holes, but it needs a long time for the operator to set the closing-pins at respective prescribed positions. Thus, it takes a long time to reset the latter PWB supporting device as well.

SUMMARY OF THE INVENTION

The present invention provides a PWB-supporting-device resetting apparatus, a PWB-holding-device resetting apparatus, a PWB-relating-operation performing system, and a PWB-supporting-device resetting method that have each feature described below. The following features are described, like claims, in respective paragraphs that are given respective sequential numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided an apparatus for automatically resetting a printed-wiring-board supporting device including a supporting table and a plurality of supporting members which are set on a surface of the supporting table to support a back surface of a printed wiring board, the apparatus comprising a supporting member storing device in which the supporting members are stored; a holding head which can hold each of the supporting members; a moving device which moves at least one of the holding head, and each of the supporting table and the storing device, relative to the other of the holding head and the each of the supporting table and the storing device, in at least a direction parallel to the surface of the supporting table, so that the holding head takes a prescribed one of the supporting members from the storing device and sets the one supporting member at a prescribed setting position on the surface of the supporting table, and takes the one supporting member from the setting position and stores the one supporting member in the storing device; and a control device which controls the moving device.

According to this feature, each of the supporting members may be one which has at least the function of supporting the printed wiring board (PWB). Therefore, each supporting member may be either a holding member which supports the PWB while sucking and holding the same, or a simple member which just supports the PWB but does not have the sucking-and-holding function. In the former case, the PWB supporting device can be called a PWB holding device.

The automatic resetting apparatus according to this feature may be provided as part of a PWB-relating-operation performing system which includes an operation performing device that performs an operation for a front surface of a PWB supported by a PWB supporting device, so that the resetting apparatus may automatically reset the PWB supporting device inside the system. Alternatively, the present resetting apparatus may be provided independent of a PWB-relating-operation performing system, so that the resetting apparatus may automatically reset a PWB supporting device outside the system. In the former case, the operation performing device of the system and the automatic resetting apparatus may be supported by a common main frame, and the PWB supporting device may not be detached from the main frame. In the latter case, a main frame of the performing system and a main frame of the resetting apparatus are independent of each other, and the PWB supporting device is attached to, and detached from, each of the respective main frames of the system and the apparatus.

In order to reset the PWB supporting device, the moving device moves one of the holding head, and each of the supporting table and the storing device, relative to the other of the holding head and the each of the supporting table and the storing device, so that the holding head detaches the supporting members currently set on the supporting table, from the supporting table, and stores the detached supporting members in the storing device, and takes, from the storing device, the supporting members to be used to support the next PWB, and sets the taken supporting members on the supporting table. Thus, the detaching, storing, taking, and setting of the supporting members are automatically performed, that is, the resetting operation is performed in a short time without needing the help of an operator.

(2) According to a second feature of the present invention, there is provided an apparatus for automatically resetting a printed-wiring-board holding device including a holding table having a surface and a plurality of negative-pressure-supply holes opening in the surface, and additionally including a plurality of holding members each of which has a support surface and a negative-pressure passage formed therethrough and is set on the surface of the holding table to support, at the support surface thereof, a back surface of a printed wiring board, and apply a negative pressure supplied via the negative-pressure passage thereof from at least one of the negative-pressure-supply holes, to the back surface of the printed wiring board and thereby hold the board, the apparatus comprising a holding-member storing device in which the holding members are stored; a first holding head which can hold each of the holding members; a first moving device which moves at least one of the first holding head, and each of the holding table and the holding-member storing device, relative to the other of the first holding head and the each of the holding table and the holding-member storing device, in at least a direction parallel to the surface of the holding table, so that the first holding head takes a prescribed one of the holding members from the holding-member storing device and sets the one holding member at a prescribed setting position on the surface of the holding table, and takes the one holding member from the setting position and stores the one holding member in the holding-member storing device; a plurality of closing members each of which is set on the surface of the holding table and closes one of the negative-pressure-supply holes that is not communicated with the negative-pressure passages of any holding members; a closing-member storing device in which the closing members are stored; a second holding head which can hold each of the closing members; a second moving device which moves at least one of the second holding head, and each of the holding table and the closing-member storing device, relative to the other of the second holding head and the each of the holding table and the closing-member storing device, in at least a direction parallel to the surface of the holding table, so that the second holding head takes a prescribed one of the closing members from the closing-member storing device and sets the one closing member at a prescribed closing position on the surface of the holding table where the one closing member closes a prescribed one of the negative-pressure-supply holes that is not communicated with the negative-pressure passages of any holding members, and the second holding head takes the one closing member from the closing position and stores the one closing member in the closing-member storing device; and a control device which controls the first moving device so that the first holding head takes the one holding member from the holding-member storing device and sets the one holding member at the setting position, and takes the one holding member from the setting position and stores the one holding member in the holding-member storing device, and controls the second moving device so that the second holding head takes the one closing member from the closing-member storing device and sets the one closing member at the closing position, and takes the one closing member from the closing position and stores the one closing member in the closing-member storing device.

Like the automatic resetting apparatus according to the first feature (1), the automatic resetting apparatus according to this feature may be provided as part of a PWB-relating-operation performing system, or may be provided independent of a PWB-relating-operation performing system.

As described previously, the holding members can hold only limited areas of the back surface of the PWB. Therefore, the holding members are set at only respective setting positions corresponding to selected ones of the negative-pressure-supply holes provided in the holding table, and the closing members are set to close the negative-pressure-supply holes to which the holding members are not attached, thereby preventing the leakage of negative pressure. The automatic resetting apparatus according to this feature automatically sets the holding members and the closing members on the holding table and automatically stores the holding and closing members in the storing device. Thus, the PWB holding device that applies negative pressure to the PWB and thereby holds the same can be reset in a short time.

(3) According to a third feature of the present invention that includes the second feature (2), the second holding head is provided by the first holding head, and the second moving device is provided by the first moving device.

According to this feature, the automatic resetting apparatus can be constructed with ease and manufactured at low cost.

(4) According to a fourth feature of the present invention that includes the second or third feature (2) or (3), the closing-member storing device is provided by the holding-member storing device.

The holding-member storing device may be one which has a holding-member storing area and a closing-member storing area for storing the holding members and the closing members, respectively, separately from each other, or one which stores the holding members and the closing members in a mixed manner.

Alternatively, the closing-member storing device and the holding-member storing device may be provided independent of each other. However, according to the fourth feature (4), the single storing device stores both the holding and closing members, and accordingly the resetting apparatus enjoys a simplified construction. In addition, the distance of relative movement between the holding head and each of the storing device and the holding table can be reduced, which leads to shortening the time needed to perform the resetting operation.

(5) According to a fifth feature of the present invention that includes any one of the second to fourth features (2) to (4), the resetting apparatus further comprises a holding-table holding device which holds the holding table such that the holding table is detachable therefrom.

The present feature may be employed in the automatic PWB-supporting-device resetting apparatus according to the first feature (1).

The holding table may be attached to, and detached from, the holding-table holding device, either manually by an operator, or automatically by an attaching and detaching device.

In the case where an automatic resetting apparatus which is provided independent of a PWB-relating-operation performing system performs, outside the system, a plurality of resetting operations for a plurality of PWB holding devices, respectively, the PWB holding devices are sequentially attached to, and detached from, the automatic resetting apparatus. To this end, the holding-table holding device is employed to hold the holding table of each of the PWB holding devices. The present feature is effective in the case where the holding-table holding device has such a construction which assures that each holding table can be attached thereto and detached therefrom in a time shorter than a time needed by an automatic resetting apparatus employed by a PWB-relating-operation performing system to perform each automatic resetting operation. In the last case, the advantage that each automatic resetting operation can be performed in a reduced time is not damaged.

(6) According to a sixth feature of the present invention, there is provided a system for performing an operation relating a printed wiring board, comprising a main frame; a printed-wiring-board supporting device including a supporting table provided on the main frame, and a plurality of supporting members set on a surface of the supporting table to support a back surface of the printed wiring board; an operation performing device which is provided on the main frame and performs an operation for a front surface of the printed wiring board supported by the printed-wiring-board supporting device; a supporting-member storing device in which the supporting members are stored; a holding head which can hold each of the supporting members; a moving device which moves at least one of the holding head, and each of the supporting table and the storing device, relative to the other of the holding head and the each of the supporting table and the storing device, in at least a direction parallel to the surface of the supporting table, so that the holding head takes a prescribed one of the supporting members from the storing device and sets the one supporting member at a prescribed setting position on the surface of the supporting table, and takes the one supporting member from the setting position and stores the one supporting member in the storing device; and a control device which controls the moving device.

The operation performing device may be an electric-component mounting device which mounts electric components (ECs) on a front surface of PWB; a screen printing machine which screen-prints creamed solder on a front surface of a PWB; a highly-viscous-fluid applying device which sequentially applies a highly viscous fluid, such as adhesive, to a single spot, or plural spots, on a front surface of each of PWBs; or an electric-circuit inspecting device which inspects an electric circuit formed on a front surface of a PWB.

According to this feature, the PWB supporting device is automatically reset inside the PWB-relating-operation performing system.

(7) According to a seventh feature of the present invention, there is provided a system for performing an operation relating a printed wiring board, comprising a main frame; a printed-wiring-board holding device which is provided on the main frame, and includes a holding table having a surface and a plurality of negative-pressure-supply holes opening in the surface, and additionally includes a plurality of holding members each of which has a support surface, a bottom surface for close contact with the surface of the holding table, and a negative-pressure passage formed therethrough, and is set on the surface of the holding table such that the negative-pressure passage thereof is communicated with at least one of the negative-pressure-supply holes, so that the support surface of the each holding member supports the back surface of the printed wiring board and a negative pressure supplied via the negative-pressure passage from the at least one negative-pressure-supply hole is applied to the back surface of the board to hold the board; an operation performing device which is provided on the main frame and performs an operation for a front surface of the printed wiring board supported by the printed-wiring-board supporting device; a holding-member storing device which is provided on the main frame and in which the holding members are stored; a first holding head which can hold each of the holding members; a first moving device which moves at least one of the first holding head, and each of the holding table and the holding-member storing device, relative to the other of the first holding head and the each of the holding table and the holding-member storing device, in at least a direction parallel to the surface of the holding table, so that the first holding head takes a prescribed one of the holding members from the holding-member storing device and sets the one holding member at a prescribed setting position on the surface of the holding table, and takes the one holding member from the setting position and stores the one holding member in the holding-member storing device; a plurality of closing members each of which is set on the surface of the holding table and closes one of the negative-pressure-supply holes that is not communicated with the negative-pressure passages of any holding members; a closing-member storing device which is provided on the main frame and in which the closing members are stored; a second holding head which can hold each of the closing members; a second moving device which moves at least one of the second holding head, and each of the holding table and the closing-member storing device, relative to the other of the second holding head and the each of the holding table and the closing-member storing device, in at least a direction parallel to the surface of the holding table, so that the second holding head takes a prescribed one of the closing members from the closing-member storing device and sets the one closing member at a prescribed closing position on the surface of the holding table where the one closing member closes a prescribed one of the negative-pressure-supply holes that is not communicated with the negative-pressure passages of any holding members, and the second holding head takes the one closing member from the closing position and stores the one closing member in the closing-member storing device; and a control device which controls the first moving device so that the first holding head takes the one holding member from the holding-member storing device and sets the one holding member at the setting position, and takes the one holding member from the setting position and stores the one holding member in the holding-member storing device, and controls the second moving device so that the second holding head takes the one closing member from the closing-member storing device and sets the one closing member at the closing position, and takes the one closing member from the closing position and stores the one closing member in the closing-member storing device.

According to this feature, the PWB supporting device is automatically reset inside the PWB-relating-operation performing system.

(8) According to an eighth feature of the present invention that includes the seventh feature (7), the second holding head is provided by the first holding head, and the second moving device is provided by the first moving device.

(9) According to a ninth feature of the present invention that includes the seventh or eighth feature (7) or (8), the closing-member storing device is provided by the holding-member storing device.

(10) According to a tenth feature of the present invention that includes any one of the seventh to ninth features (7) to (9), the operation performing device comprises an operation performing head which performs the operation, and the first moving device moves at least one of the operation performing head and the printed-wiring-board supporting device, relative to the other of the operation performing head and the printed-wiring-board supporting device, in at least a direction parallel to the surface of the holding table, so that the operation performing head performs the operation.

According to this feature, the first moving device includes a portion that provides the relative movement between the operation performing head and the printed-wiring-board supporting device, in the direction parallel to the surface of the holding table.

(11) According to an eleventh feature of the present invention, there is provided a method of setting a printed-wiring-board supporting device of a printed-wiring-board-relating-operation performing system, the printed-wiring-board supporting device including a supporting table and a plurality of supporting members for being set on a surface of the supporting table to support a back surface of a printed wiring board, the printed-wiring-board-relating-operation performing system additionally including a main frame on which the supporting table is provided, and an operation performing device which is provided on the main frame and performs an operation for a front surface of the printed wiring board supported by the printed-wiring-board supporting device, the method comprising the steps of detaching the supporting table from the main frame of the system, setting, at a place outside the system, the supporting members on the supporting table, and attaching the supporting table on which the supporting members have been set, to the main frame of the system.

The supporting table may be attached to, and detached from, the main frame, either manually by an operator or automatically by an attaching and detaching device. In the state in which the supporting table, detached from the main frame of the PWB-relating-operation performing system, is placed outside the system, the supporting members may be set on the supporting table, either automatically by an apparatus having a construction similar to that of the automatic resetting apparatus according to the first feature (1), or manually by an operator.

The supporting table may be one which is used commonly for a plurality of sorts of PWBs, or one which is used exclusively for a single sort of PWBs. In the case where the supporting table is used commonly for a plurality of sorts of PWBs having different sizes, the supporting table should have such a size which assures that the supporting table can support the PWB having the largest size.

According to this feature, each of the supporting members may be a holding member which has the function of applying negative pressure to the PWB and thereby holding the PWB and supports the PWB by sucking and holding the same, or a simple supporting member which does not have the sucking-and-holding function.

According to this feature, the PWB holding device may be reset outside the PWB-relating-operation performing system, at an arbitrary timing, independent of the current state of the system. Therefore, while the operation is performed for the current PWBs, the supporting members can be set on the supporting table, so that the PWB holding device is reset and made read for supporting a new sort of PWBs which will replace the current sort of PWBs. Thus, the system can be reset by replacing the current PWB holding device with the thus reset PWB holding device, which leads to shortening the time needed to reset each PWB holding device to be used with the system. Thus, the efficiency of operation of the system can be improved.

(12) According to a twelfth feature of the present invention that includes the eleventh feature (11), the supporting table comprises a holding table having a plurality of negative-pressure-supply holes opening in the surface thereof, and the supporting members comprise a plurality of holding members each of which has a support surface, a bottom surface for close contact with the surface of the holding table, and a negative-pressure passage formed therethrough, the step of setting comprises setting, on the holding table detached from the main frame, each of the holding members such that the negative-pressure passage of the each holding member is communicated with at least one of the negative-pressure-supply holes of the holding table, and the step of attaching comprises closing, with at least one closing member, at least one of the negative-pressure-supply holes that is not communicated with the negative-pressure passages of any holding members and open in the surface of the holding table, and attaching the holding table with the holding members and the at least one closing member, to the main frame of the system.

Otherwise, the negative-pressure-supply holes of the holding table may be provided with respective opening and closing valves, as disclosed in one of Japanese patent applications which were filed on the same day by the assignee of the present application and from another of which the present application claims priority. In this case, each of the valves is opened by attaching a holding member to a corresponding one of the holes, and the holes to which the holding members are not attached remain closed by the valves. Thus, it is not needed to close, with closing members, the holes to which the holding members are not attached. The present method may be used to set this sort of PWB holding device. However, the present method is more effective in setting the PWB holding device of the sort recited in the twelfth feature (12), because it needs a longer time to set the same.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 14 is a view for explaining pin-setting information used to set the holding pins and the closing pins;

DETAILED DESCRIPTION OF PREFERRED EMBODIMENTS

Hereinafter, there will be described in detail an embodiment of the present invention as applied to an automatic resetting apparatus which resets a printed-wiring-board (PWB) holding device employed in an electric-component (EC) mounting system, and to the EC mounting system, by reference to the drawings.

Figure 1:
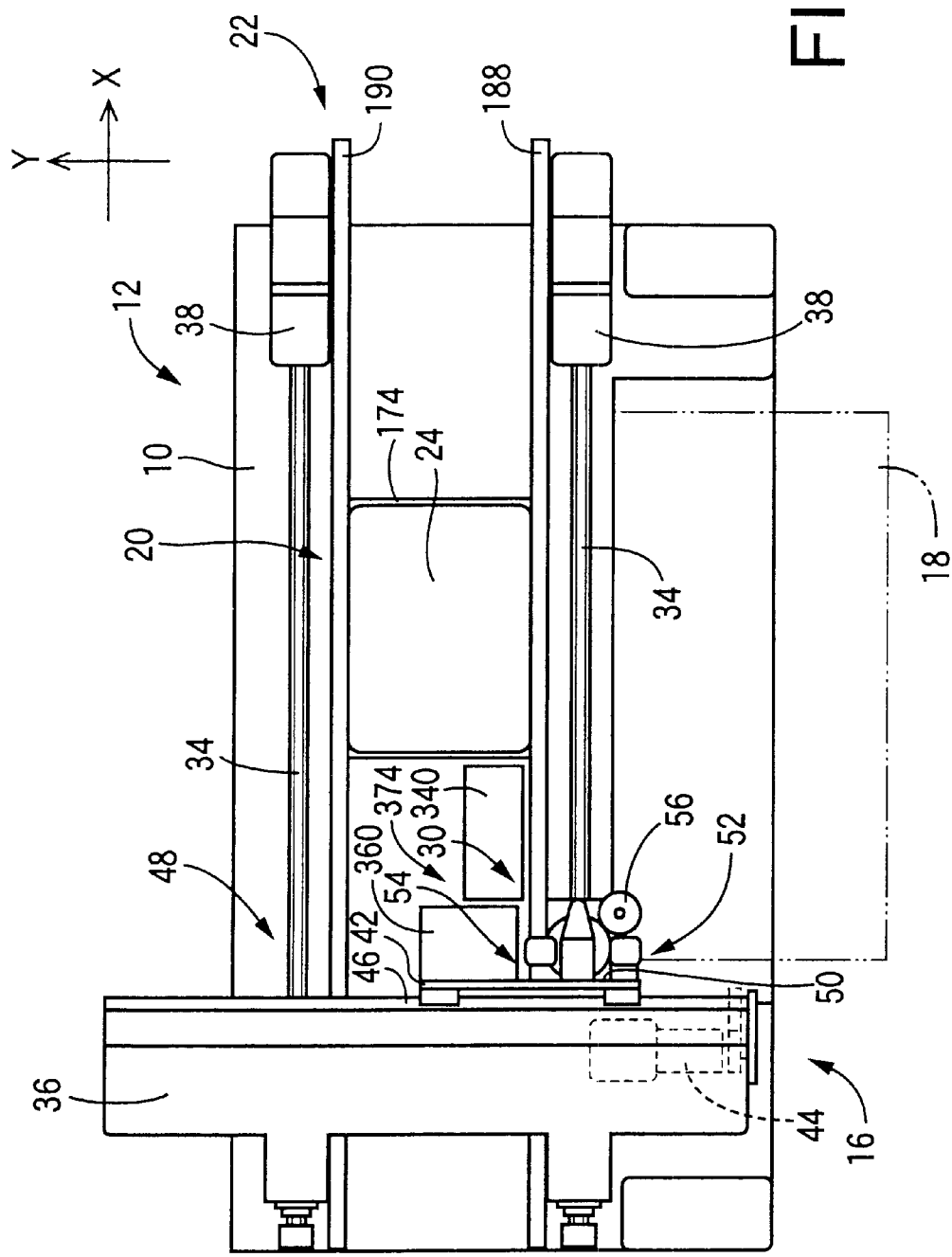
FIG. 1 is a schematic plan view of an electric-component (EC) mounting system including an automatic resetting apparatus which resets a printed-wiring-board (PWB) holding device and to which the present invention is applied.

In FIG. 1, reference numeral 10 designates a base as a main frame of an EC mounting system 12 as a PWB-relating-operation performing system. On the base 10, there are provided an EC mounting device 16 as an operation performing device, an EC supplying device 18, and a PWB supporting and conveying device 20. The PWB supporting and conveying device 20 includes a PWB conveyor 22 which extends in an X-axis direction (i.e., a left-right direction in FIG. 1) and which conveys a PWB 24 in the X-axis direction, and positions and supports the PWB 24 at a prescribed EC-mount position where the PWB 24 is stopped by a stopper as a stopping device, not shown. The PWB supporting and conveying device 20 will be described in more detail later. The EC supplying device 18 is provided on one side of the PWB conveyor 22. Since, however, the EC supplying device 18 is not relevant to the present invention, no description thereof is made here.

The EC mounting device 16 has a construction similar to an EC mounting device disclosed in Japanese Patent No. 2,824,378, and accordingly it is briefly described here.

The EC mounting device 16 includes an EC mounting head 30 as an operation performing head that is linearly movable in each of the X-axis direction and a Y-axis direction perpendicular to the X-axis direction to convey an EC 32, in particular, an electronic component, and mount the same. To this end, on the base 10, there are provided, on both sides of the PWB conveyor 22 in the Y-axis direction, two ball screws 34 which extend parallel to the X-axis direction and which are threadedly engaged with two nuts, not shown, fixed to an X-axis table 36. When the ball screws 34 are rotated by respective X-axis-table drive motors 38, the X-axis table 36 is moved in the X-axis direction. On the bed 10, there are provided two guide rails as guide members, not shown, below the two ball screws 34, and the movement of the X-axis table 36 is guided by the two guide rails and two guide blocks as guided members, not shown, fixed to the table 36 such that the two guide blocks slide on the two guide rails, respectively.

The X-axis table 36 supports a ball screw 40 (FIG. 2) which extends parallel to the Y-axis direction and which is threadedly engaged with a nut, not show, fixed to a Y-axis table 42. When the ball screw 40 is rotated by a Y-axis-table drive motor 44 (FIG. 1), the Y-axis table 42 is moved while being guided by two guide rails 46 as guide members. Thus, the nuts, the ball screws 34, the X-axis table 36, and the X-axis-table drive motors 38, and, the nut, the ball screw 40, the Y-axis table 42, and the Y-axis-table drive motor 44 cooperate with each another to provide an X-Y robot 48 which moves the EC mounting head 30 in directions parallel to a surface of the PWB 24. The PWB 24 is horizontally conveyed, positioned, and supported, and the EC mounting head 30 is moved by the X-Y robot 48 to an arbitrary position on a horizontal plane.

Figure 2:
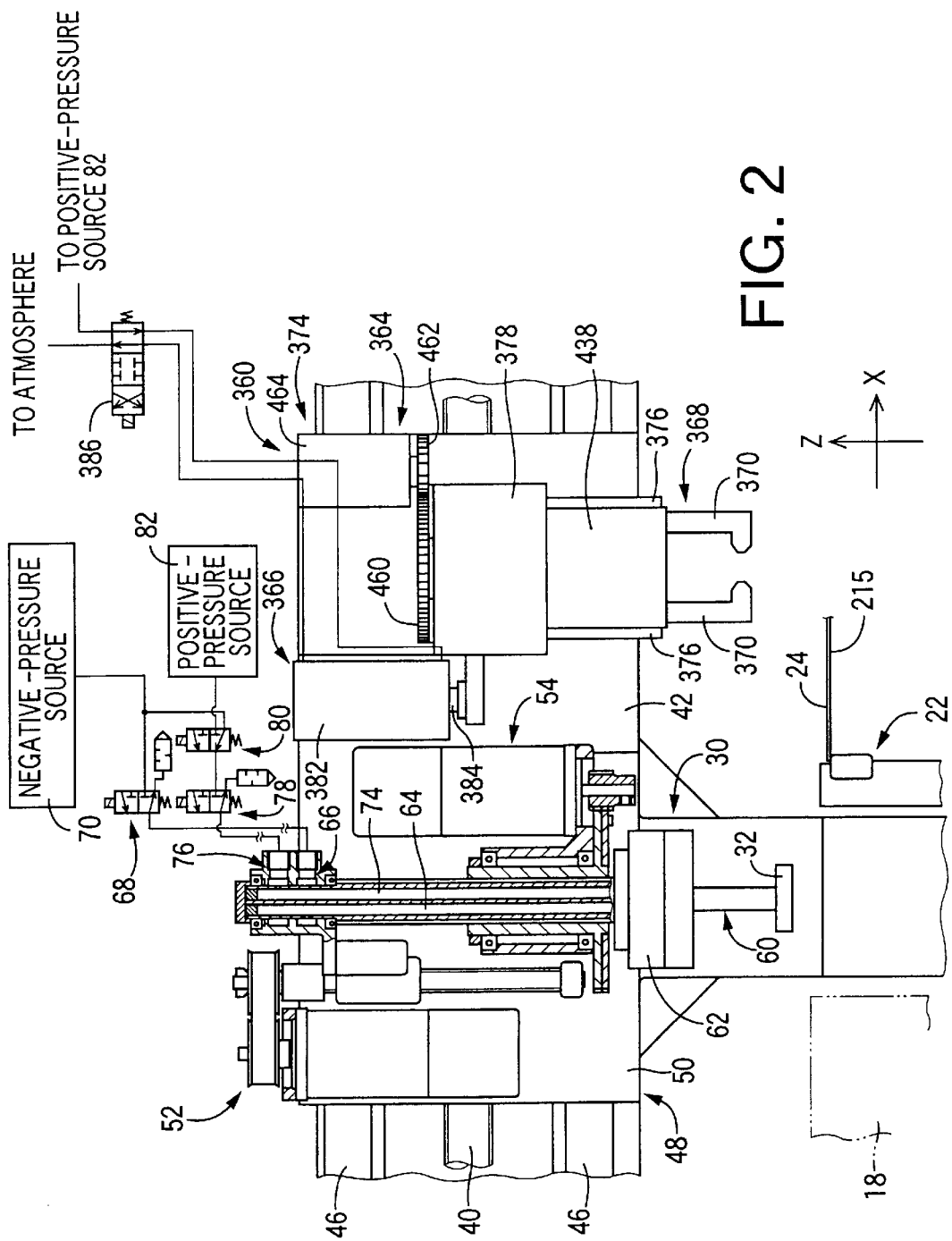
FIG. 2 is a side elevation view of an EC mounting device of the EC mounting system that includes a suction nozzle and a pin holder, and a Y-axis table supporting the suction nozzle and the pin holder.

On the X-axis table 36, there is provided a CCD (charge-coupled device) camera as an image taking device, below the Y-axis table 42, at a position between the EC supplying device 18 and the PWB supporting and conveying device 20 in the Y-axis direction. The CCD camera takes an image of the EC 32 held by the EC mounting head 30. Since, however, this CCD camera is not relevant to the present invention, no description thereof is made here. As shown in FIG. 2, the EC mounting head 30 is attached to a vertical side surface 50 of the Y-axis table 42, such that the head 30 is movable upward and downward and is rotatable. The side surface 50 supports an elevating and lowering device 52 which elevates and lowers the head 30; a rotating device 54 which rotates the head 30 about its centerline; and a CCD camera 56 as an image taking device that takes an image of each of a plurality of fiducial marks provided on the PWB 24. The CCD camera 56 is not shown in FIG. 2. In the present embodiment, the Y-axis table 42 supports a lighting device, not shown, which lights an object when the CCD camera 56 takes an image of the object.

As shown in FIG. 2, the EC mounting head 30 includes a suction nozzle 60 as a sort of component holder that sucks and holds the EC 32, and a nozzle holder 62 which holds the suction nozzle 60 such that the nozzle 60 is detachable from the holder 62. The nozzle holder 62 is moved by the X-Y table 48 to an arbitrary position on the horizontal plane. In the present embodiment, the nozzle holder 62 applies a suction or a negative pressure to the suction nozzle 60 and thereby holds the nozzle 60. To this end, the nozzle holder 62 is connected to a negative-pressure supply source 70 and the atmosphere via an air passage 64, a rotary valve 66, and a solenoid-operated direction-switch valve 68 and, when the direction-switch valve 68 is switched, the holder 62 is selectively communicated with the supply source 70 or the atmosphere, so that the holder 62 holds or releases the nozzle 60. In addition, the suction nozzle 60 is connected to the negative-pressure supply source 70, a positive-pressure supply source 82, and the atmosphere via an air passage 74, a rotary valve 76, and two solenoid-operated direction-switch valves 78, 80 and, when the direction-switch valves 68 are switched, the nozzle 60 is selectively communicated with the negative-pressure supply source 70, the positive-pressure supply source 82, or the atmosphere. The suction nozzle 62 applies a negative air pressure to the EC 32 and thereby holds it, and applies a positive air pressure to the EC 32 and thereby releases it. The negative-pressure supply source 70 may be a negative-pressure supplying device or an air sucking device, and the positive-pressure supply source 82 may be an air supplying device which supplies an air having a positive pressure. In the present embodiment, the direction-switch valves 68, 78, 80 are provided on the Y-axis table 42, and the valves 68, 80 are connected to the negative-pressure supply source 70 and the positive-pressure supply source 82 via respective connectors, not shown, provided on the Y-axis table 42.

Figure 3:
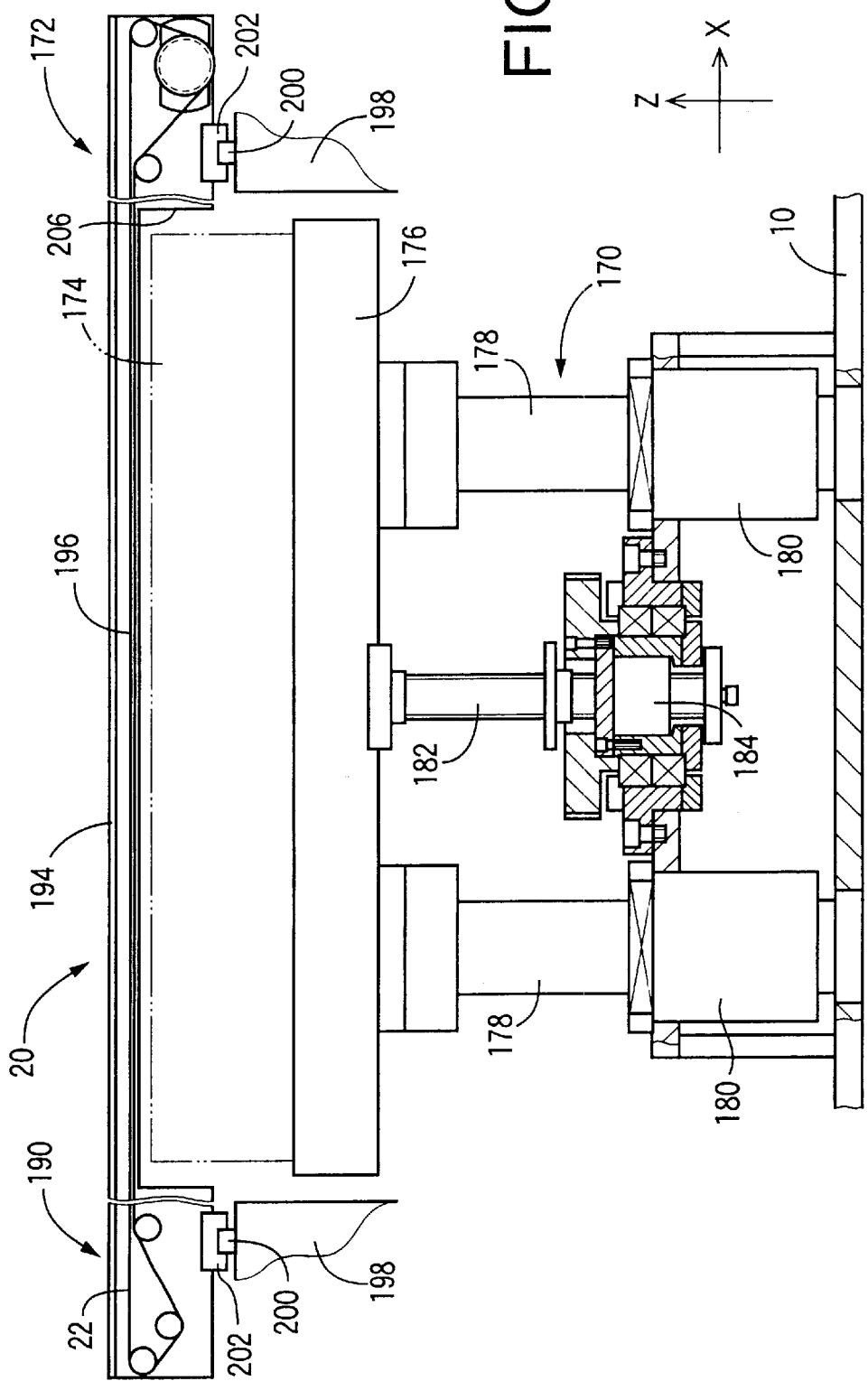
FIG. 3 is a partly cross-sectioned, front elevation view of a PWB supporting and conveying device including the PWB holding device.

As shown in FIG. 3, the PWB supporting and conveying device 20 includes a PWB elevating and lowering device 170, a PWB clamping device 172, and a PWB holding device 174. The PWB elevating and lowering device 170 includes a PWB lifter 176. Two guide rods 178 extend downward from a lower surface of the PWB lifter 176, and fit in two guide sleeves 180, respectively, fixed to the base 10, such that the lifter 176 is movable upward and downward. A ball screw 182 is fixed to the lower surface of the lifter 176, and is threadedly engaged with a nut 184 which is attached to the base 10 such that the nut 184 is rotatable about a vertical axis line and is not movable in an axial direction thereof. When the nut 184 is rotated by an elevating and lowering motor 186 (FIG. 12), the ball screw 182 is moved upward and downward, so that the PWB lifter 176 is moved upward and downward.

As shown in FIG. 1, the PWB clamping device 172 includes a fixed guide 188 and a movable guide 190 which extend parallel to a PWB-convey direction (i.e., the X-axis direction). Two conveyor belts 196 of the PWB conveyor 22 are supported by respective surfaces of the fixed and movable guides 188, 190 that are opposed to each other, and cooperate with each other to convey the PWB 24. As shown in FIG. 3, an upper end portion of the movable guide 190 provides a PWB hold-down portion 194 which somewhat projects inward toward another PWB hold-down portion 194 which is provided by an upper end portion of the fixed guide 188. Those PWB hold-down portions 194 are slightly spaced from an upper surface of the PWB 24 placed on the conveyor belts 196 as conveyor members of the PWB conveyor 22.

The opposed surfaces of the fixed and movable guides 188, 190 support respective clamping plates as movable clamping members that cooperate with the PWB hold-down portions 194 to clamp the PWB 24. The two clamping plates have an elongate shape parallel to a lengthwise direction of the fixed and movable guides 188, 190, and are normally biased by respective springs as biasing devices such that the clamping plates are held at an unclamping position where the clamping plates are spaced from the PWB hold-down portions 194 and are positioned below the conveyor belts 196. When the PWB 24 is clamped, a plurality of clamping cylinders as drive devices move the clamping plates toward the PWB hold-down portions 194 so that the clamping plates cooperate with the hold-down portions 194 to clamp opposite end portions of the PWB 24. In the present embodiment, the PWB hold-down portions 194, the clamping plates, the springs, and the clamping cylinders cooperate with one another to provide the PWB clamping device 172.

The base 10 supports the movable guide 190 such that the movable guide 190 is movable in a direction perpendicular to the PWB-convey direction, i.e., in the Y-axis direction. As shown in FIG. 3, two guide rails 200 as guide members that extend in the direction perpendicular to the PWB-convey direction on the horizontal plane are provided on respective upper-end surfaces of two support blocks 198 fixed to the base 10. Two guide blocks 202 as guided members that are fixed to a lower surface of the movable guide 190 fit on the two guide rails 200, such that the movable guide 190 is movable on the rails 200. The movable guide 190 is moved by a moving device including a feed screw and a nut, not shown, and a PWB-convey-width changing motor 204 (FIG. 13) as a drive source, so that the movable guide 190 is moved toward, and away from, the fixed guide 188 and a PWB-convey width corresponding to a width of the PWB 24 conveyed by the PWB conveyor 22 is automatically changed. The moving device and the guide rails 200 cooperate with each other to provide a PWB-convey-width changing device. As shown in FIG. 3, the movable guide 190 has a recess 206 which prevents, when the movable guide 190 is moved toward, and away from, the fixed guide 188, the movable guide 190 from interfering with the PWB holding device 174 being positioned at its downward-movement-end position.

Figure 4:
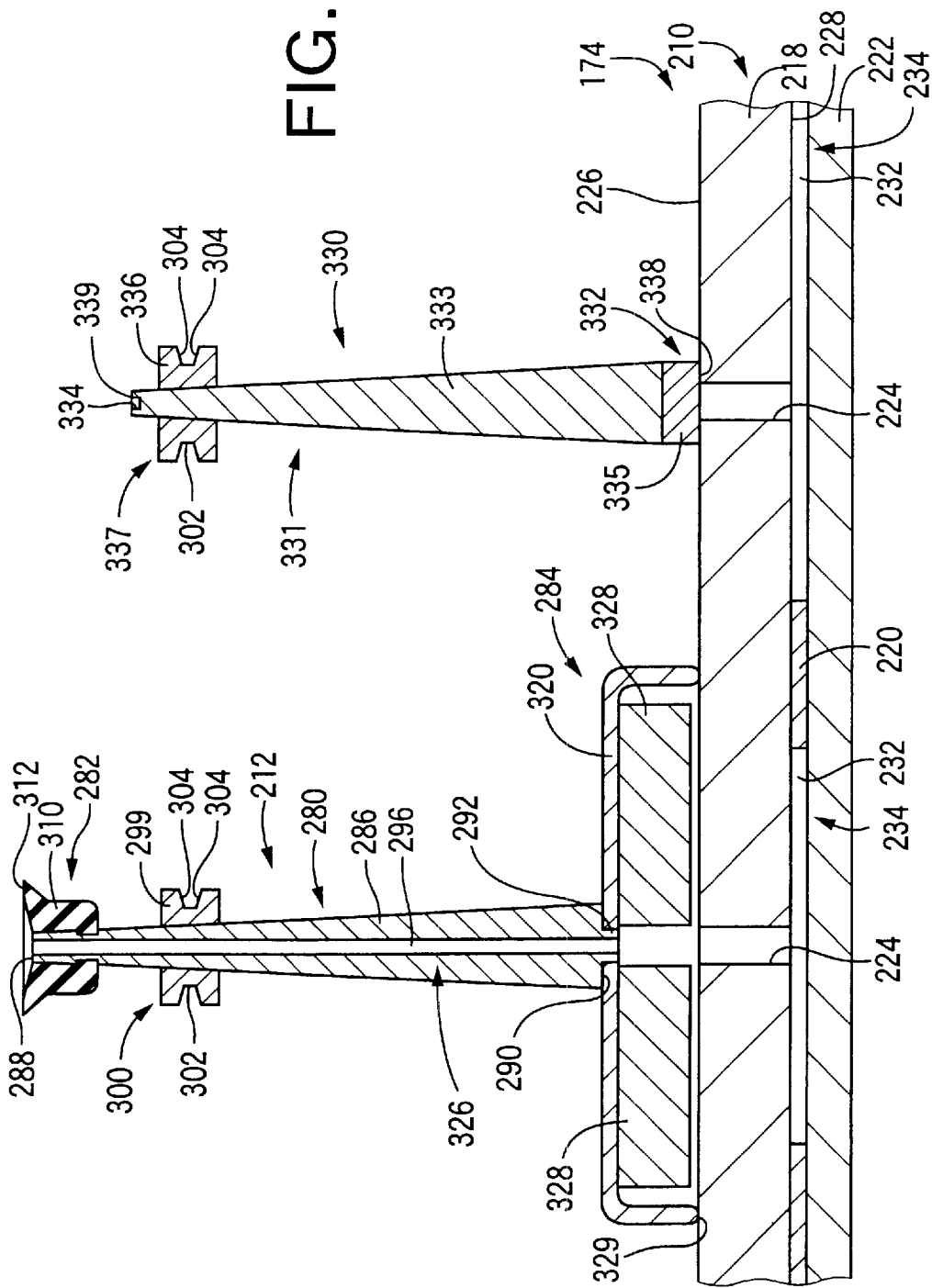
FIG. 4 is a cross-sectioned, front elevation view of the PWB holding device including a holding table, and a holding pin and a closing pin which are attached to the holding table.

The PWB holding device 174 is provided on the PWB lifter 176, and is elevated and lowered by the PWB elevating and lowering device 170. As shown in FIG. 4, the PWB holding device 174 includes a holding table 210, a plurality of holding pins 212 each as a sort of supporting member that are attachable to the holding table 210, and supports a back surface 215 (FIG. 2) of the PWB 24. Thus, the PWB holding device 174 is a sort of PWB supporting device, and the holding table 210 is a sort of supporting table.

Figure 5:
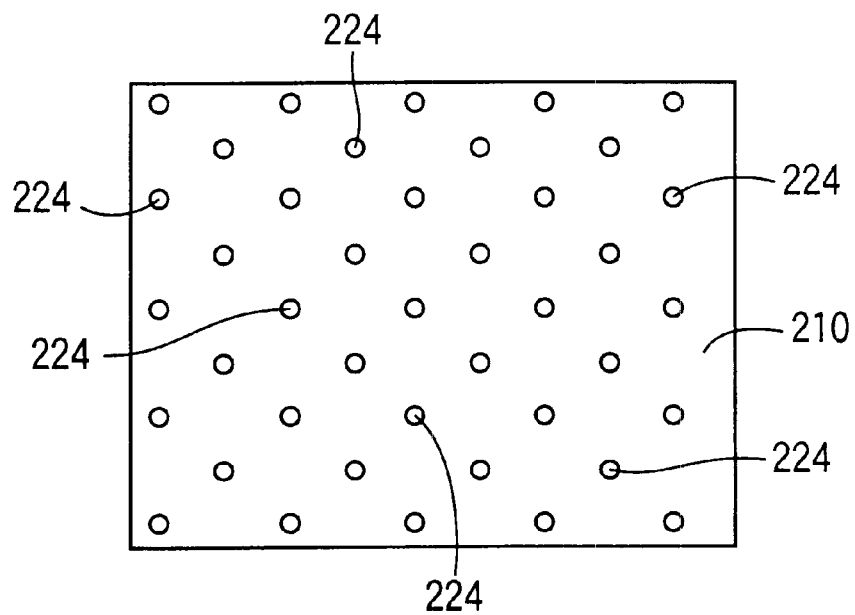
FIG. 5 is a plan view of the holding table of the PWB holding device.

The holding table 210 includes a base 218, a spacer 220, and a cover 222 which are superposed on one another. The base 218 as a main member of the holding table 210 has a plate-like shape, and is formed of a ferromagnetic material such as steel. The base 218 has a plurality of negative-pressure-supply holes 224 which are formed through the thickness thereof. Each of the holes 224 opens in an upper surface 226 of the base 218, i.e., a holding surface as a sort of supporting surface, on which the holding pins 212 are to be set, and a lower surface 228 of the same 218 on which the spacer 220 is superposed. The supply holes 224 are arranged as shown in FIG. 5.

The spacer 220 has a thin-plate-like shape having a plurality of openings 232 which are formed through the thickness thereof in respective portions thereof corresponding to the respective negative-pressure supply holes 224 of the base 218. The cover 222 also has a plate-like shape and cooperates with the base 218 to sandwich the spacer 220, so that opposite ends of each of the openings 232 of the spacer 220 are closed to provide a communication passage 234. The base 218, the spacer 220, and the cover 222 are fixed to one another in such a manner that respective outer peripheral portions of the elements 218, 220, 222, free of the communication passages 234, are fixed to one another by a fixing device such as bolts, not shown. The thus fixed elements 218, 220, 222 function as the integral holding table 210.

The cover 222 has a plurality of communication holes (not shown) which are formed through the thickness thereof and communicate with the respective communication passages 234 of the spacer 220. The holding table 210 is detachably attached to the PWB lifter 176 by an attaching device, not shown, and, in this state, the communication holes of the cover 222 are connected to respective passages, not shown, formed in the lifter 176, and are eventually connected to the negative-pressure supply source 70 via those passages. Between those passages and the supply source 70, there is provided a switch-valve device, not shown, which is switchable to selectively communicate the supply holes 224 with the supply source 70 or the atmosphere. When the holding table 210 is used to support the PWB 24, the supply holes 224 are supplied with a negative pressure from the supply source 70. Otherwise, the supply holes 224 are communicated with the atmosphere.

The base 218, the spacer 220, and the cover 222 have a high degree of flatness like those employed in a PWB holding apparatus disclosed in Japanese Patent Document No. 7-15189. Accordingly, the upper surface 226 of the holding table 210 enjoys a high degree of flatness. In the present embodiment, a surface of the PWB lifter 176 to which the PWB holding device 174 is attached is horizontal, and the holding table 210 is detachably attached to the lifter 176 such that the upper surface 226 of the holding table 210 is horizontal.

Next, the holding pins 212 will be described.

Figure 6:
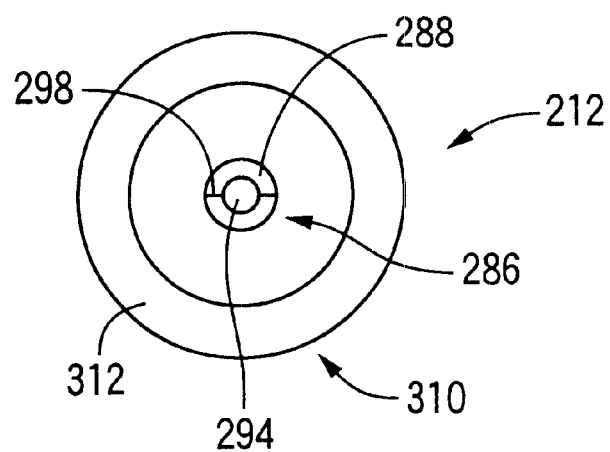
FIG. 6 is a plan view of the holding pin.

As shown in FIG. 4, each holding pin 212 includes a pin portion 280, a cup portion 282, and a seat portion 284, and applies a negative pressure to the PWB 24 to hold or support the same 24. A pin 286 functioning as the pin portion 280 of the holding pin 212 has a circular cross section, and is tapered such that its diameter decreases toward its free end (i.e., its upper end). A free or upper end surface of the pin 286 provides a flat support surface 288. The pin 286 has, at the center of a lower surface 290 thereof, a projection 292 having a circular cross section, and additionally has a passage 296 which is formed therethrough in an axial direction thereof and opens in each of the support surface 288 and an end surface of the projection 292. In the present embodiment, as shown in FIG. 6, the opening of the passage 296 in the support surface 288 is used as a fiducial mark 294 to detect a position of the holding pin 212. The support surface 288 has a fiducial line 298 which extends in a diametric direction thereof through a center thereof. In the present embodiment, the fiducial line 298 has a color different from the background color of the support surface 288. For example, if the support surface 288 is white, the fiducial line 298 is black.

Figure 9:
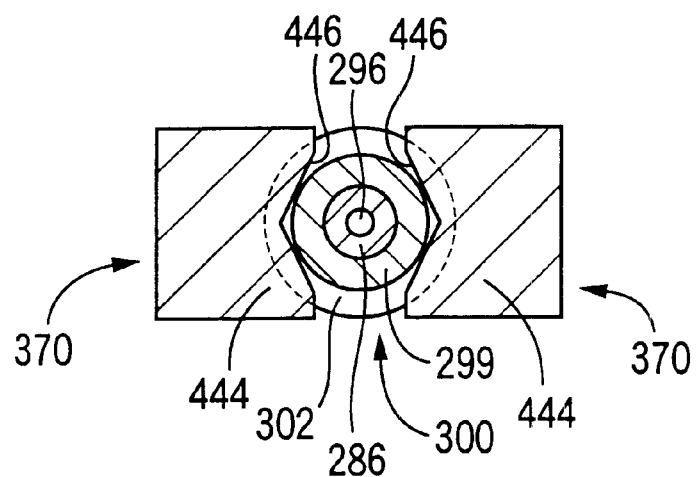
FIG. 9 is a cross-section view taken along 9—9 in FIG. 7.

A neck member 299 as an engageable member is fixed, by an appropriate fixing means or manner, such as brazing, to a portion of the pin 286 that is near to its upper end, and provides a neck portion 300 as an engageable portion. As shown in FIGS. 4 and 9, the neck portion 300 has a circular transverse cross section, and has a circular groove 302 at an intermediate portion thereof as viewed in the axial direction of the pin 286. The circular groove 302 has a trapezoidal cross section taken in the axial direction of the pin 286. A pair of side surfaces 304 defining the groove 302 are inclined such that a distance between the two side surfaces 304 increases in a radially outward direction.

A suction cup 310 fits on an upper end portion of the pin 286, such that the suction cup 310 is detachable from the pin portion 280 but is not easily pulled off the same 280. The suction cup 310 provides the cup portion 282. In the present embodiment, the suction cup 310 is formed of rubber, and has a diameter greater than that of the support surface 288. An upper portion of the cup 310 projects upward from the support surface 288, and an upper surface of the cup 310 provides a contact surface 312 which has a flat, annular shape whose diameter is greater than that of the support surface 288, surrounds the support surface 288, and faces upward.

A seat member 320 as an attached member is fixed to a lower end portion of the pin 286 that has the greatest diameter. The seat member 320 provides the seat portion 284. The seat member 320 has an elongate container-like shape, and a width of an inner space of the seat member 320 is somewhat greater than the diameter of the negative-pressure-supply hole 224 and a length of the inner space is not less than two times greater than the width thereof. An end surface of the seat member 320 provides an annular seat surface 329 which extends parallel to the support surface 288 and which closely contacts the holding table 210. The projection 292 of the pin 286 externally fits in a lengthwise middle portion of an upper wall 322 of the seat member 320, such that the pin 286 extends perpendicularly to the seat surface 329, and is fixed to the wall 322 by an appropriate fixing means or manner, such as brazing. The seat member 320 opens in the seat surface 329 opposite to the wall 322 to which the pin 286 is fixed, and the passage 296 of the pin portion 280 is communicated with the inner space of the seat member 320.

A plurality of permanent magnets 328, e.g., two permanent magnets 328 in the present embodiment, are provided in the inner space of the seat member 320, such that the permanent magnets 328 are fixed to respective portions of the wall 322 on both sides of the passage 296. Thus, the passage 296 is communicated with the middle portion of the inner space of the seat member 320. Each of the permanent magnets 328 has a rectangular parallelepiped shape, and has a thickness somewhat smaller than a depth of the seat member 320, so that the each magnet 328 is located somewhat inward of the seat surface 329 as the annular end surface of the seat member 320. A width of each magnet 328 is somewhat smaller than that of the inner space of the seat member 320, and a small clearance is left between the each magnet 328 and each of opposite side walls of the seat member 320. In the present embodiment, the passage 296, and the small clearances left between the permanent magnets 328 and the side walls of the seat member 320 cooperate with each other to provide a negative-pressure passage 326 which extends from the seat surface 329 of the holding pin 212 to the opposite, support surface 288 thereof, through the entire length thereof.

As described later, the holding pins 212 are not attached to all of the negative-pressure-supply holes 224 of the holding table 210, i.e., are attached to some of the supply holes 224. The other supply holes 224 to which the holding pins 212 are not attached are closed by closing pins 330 each as a closing member. As shown in FIG. 4, each closing pin 330 includes a pin portion 331 and a closing portion 332, and has such a height which assures that when the PWB holding device 174 holds the PWB 24, the closing pin 330 does not interfere with the ECs 32 mounted on the back surface of the PWB 24 or the uneven portions of the same. The pin portion 331 is provided by a pin 333 which has a circular cross section and whose diameter decreases in a direction toward a free end surface thereof. The pin 333 has a recess 334 which opens in the free end surface thereof and which provides a fiducial mark 339.

The closing portion 332 is provided by a permanent magnet 335 which is fixed to a lower end of the pin 333 that has the greatest diameter. In the present embodiment, the permanent magnet 335 has a circular cross section whose diameter is greater than that of the negative-pressure-supply hole 224. The closing pin 330 includes, in the vicinity of an upper end portion of the pin 333, a neck portion 337 which is provided by a neck member 336 which is fixed to the upper end portion by an appropriate fixing means, e.g., brazing. The neck portion 337 has a shape and a size similar to those of the neck portion 300 of the holding pin 212. The same numerals as used for the neck portion 300 are used to designate the counterparts of the neck portion 337, and the description thereof is omitted. The distance between the neck portion 337 and a bottom surface 338 of the closing portion 332 that is opposite to the pin portion 331 and is to closely contact the holding table 210, is equal to the distance between the neck portion 300, and the seat member 329, of the holding pin 212. Thus, when the holding pin 212 and the closing pin 330 are set on a common supporting surface, the respective neck portions 300, 337 take a same height position.

As shown in FIG. 1, a pin-storing device 340 (hereinafter, referred to as the storing device 340) is provided adjacent to the PWB holding device 174. The storing device 340 stores a plurality of holding pins 212 and a plurality of closing pins 330. In the present embodiment, the storing device 340 functions as both a holding-member storing device and a closing-member storing device.

In the present embodiment, the storing device 340 is elongate in the X-axis direction and has, in the Y-axis direction, a length somewhat smaller than a minimum distance between the fixed and movable guides 188, 190, so that the pins 212, 330 stored in the storing device 340, provided on the side of the fixed guide 188, do not interfere with the movable guide 190. The storing device 340 is not shown in FIG. 3.

Figure 12:
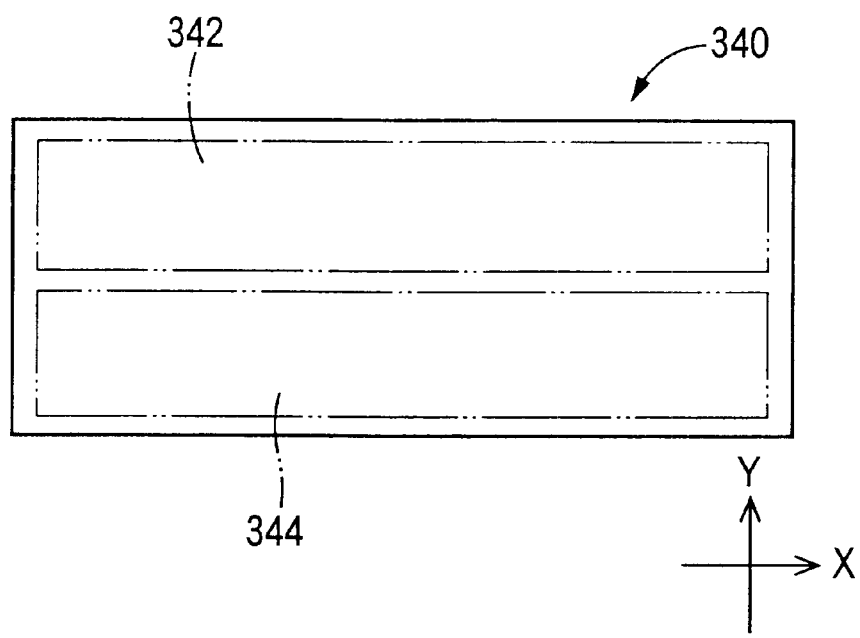
FIG. 12 is a plan view of a storing device in which holding pins and closing pins are stored.

The storing device 340 includes a supporting or storing table, not shown, that supports and stores the holding pins 212 and the closing pins 330. As schematically shown in FIG. 12, the supporting table has a holding-pin storing area 342 which stores a plurality of holding pins 212, and a closing-pin storing area 344 which stores a plurality of closing pins 330. In the present embodiment, the two areas 342, 344 are arranged in the Y-axis direction, and each area is adjacent to the PWB holding device 174 in the X-axis direction.

The holding pin storing area 342 has a plurality of prescribed storing positions at each of which a holding pin 212 is stored; and the closing-pin storing area 344 has a plurality of prescribed storing positions at each of which a closing pin 330 is stored. For example, the two storing areas 342, 344 have, at each of the storing positions thereof, a recess, not shown, in which a lower portion of the seat member 320 or the permanent magnet 335 of a holding pin 212 or a closing pin 330 fits. The recess has a transverse cross section shape similar to that of the seat member 320 or the permanent magnet 335, and has a size somewhat greater than that of the seat member 320 or the permanent magnet 335. Each of the two storing areas 342, 344 has a plurality of recesses in the X-axis direction and a plurality of recesses in the Y-axis direction. An upper open end of each of the recesses is tapered in an upward direction, and the tapered open end guides the fitting of a holding or closing pin 212, 330 into the each recess. In the present embodiment, the recesses of the holding-pin storing area 342 are formed such that when the holding pins 212 fit in those recesses, respective lengthwise directions of the respective seat members 320 of the holding pins 212 are parallel to the X-axis direction, and the recesses of the closing-pin storing area 344 are formed such that when the closing pins 330 fit in those recesses, each pair of closing pins 330 adjacent to each other in the X-axis direction are spaced from each other by a distance which assures that a pair of grasping fingers 370 of a pin holder 368, described later, can be opened and closed in that space. Initially, an operator manually stores the holding pins 212 and the closing pins 330 in the storing device 340. However, it is possible to automatically store the pins 212, 330 in the storing device 340. The recesses may be replaced with marks defining the storing positions. For example, marks which have the same shape and size as those of the cross section of the seat members 320 or the permanent magnets 335 are depicted on a supporting surface of the storing device 340 that supports the holding pins 212 and the closing pins 330, and the pins 212, 330 are set on the marks, respectively.

The holding pins 212 and the closing pins 330 are stored in the storing device 340, such that the pins 122, 330 fit in the recesses formed in the storing areas 342, 344 and take a vertical posture oriented upward. Respective bottom surfaces of the recesses, that is, the support surfaces that support the holding pins 212 and the closing pins 330 take the same height position as that of the upper surface 226 of the holding table 210 of the PWB holding device 174 being positioned at its downward-movement-end position. Therefore, the respective neck portions 300, 337 of the holding pins 212 and the closing pins 330 stored in the storing device 340 take the same height position as that of the respective neck portions 300, 337 of the holding pins 212 and the closing pins 330 attached to the holding table 210 being positioned at its downward-movement-end position.

In the present embodiment, at least a surface portion of the supporting table of the storing device 340 in which the above-described recesses are formed is formed of steel as a sort of ferromagnetic material. Therefore, when a holding pin 212 or a closing pin 330 fits in a recess of the supporting table, the supporting table is magnetized, and the holding pin 212 or the closing 300 is fixed by a magnetic force to the supporting table.

Figure 7:
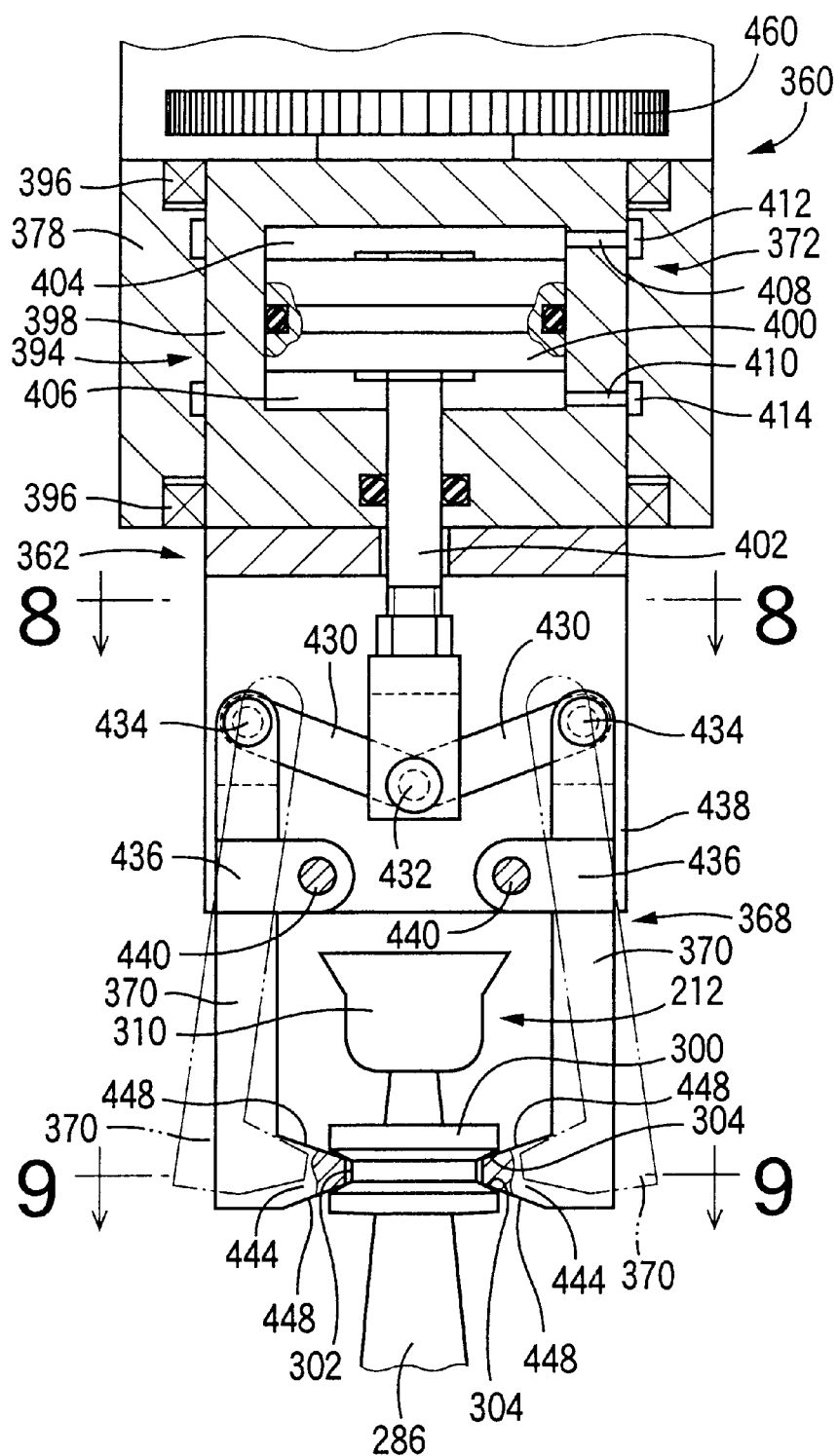
FIG. 7 is a partly cross-sectioned, side elevation view of a holding head of the automatic PWB-holding-device resetting apparatus.

In the present embodiment, the setting and resetting of each holding pin 212 or each closing pin 330 to and from the holding table 210 are automatically performed by utilizing the X-Y robot 48 of the EC mounting device 16. To this end, as shown in FIGS. 2 and 7, the Y-axis table 42 supports a holding unit 360 which includes a holding head 362; a rotating device 364 which rotates the holding head 362 about a vertical axis line perpendicular to the upper surface 226 of the holding table 210; and an elevating and lowering device 366 which elevates and lowers the holding head 362. The holding head 362 includes a pin holder 368 as a holding-member holder or a supporting-member holder; and a finger drive device 372 (FIG. 7) that opens and closes a pair of grasping fingers 370 as part of the pin holder 368. The X-Y robot 48 and the holding unit 360 cooperate with each other to provide a mechanical portion of an automatic resetting apparatus 374; and the mechanical portion cooperates with the storing device 340 and a portion of a control device 500, described later, that controls the mechanical portion, to provide the automatic resetting apparatus 374 which automatically resets the PWB holding device 174.

Figure 10:
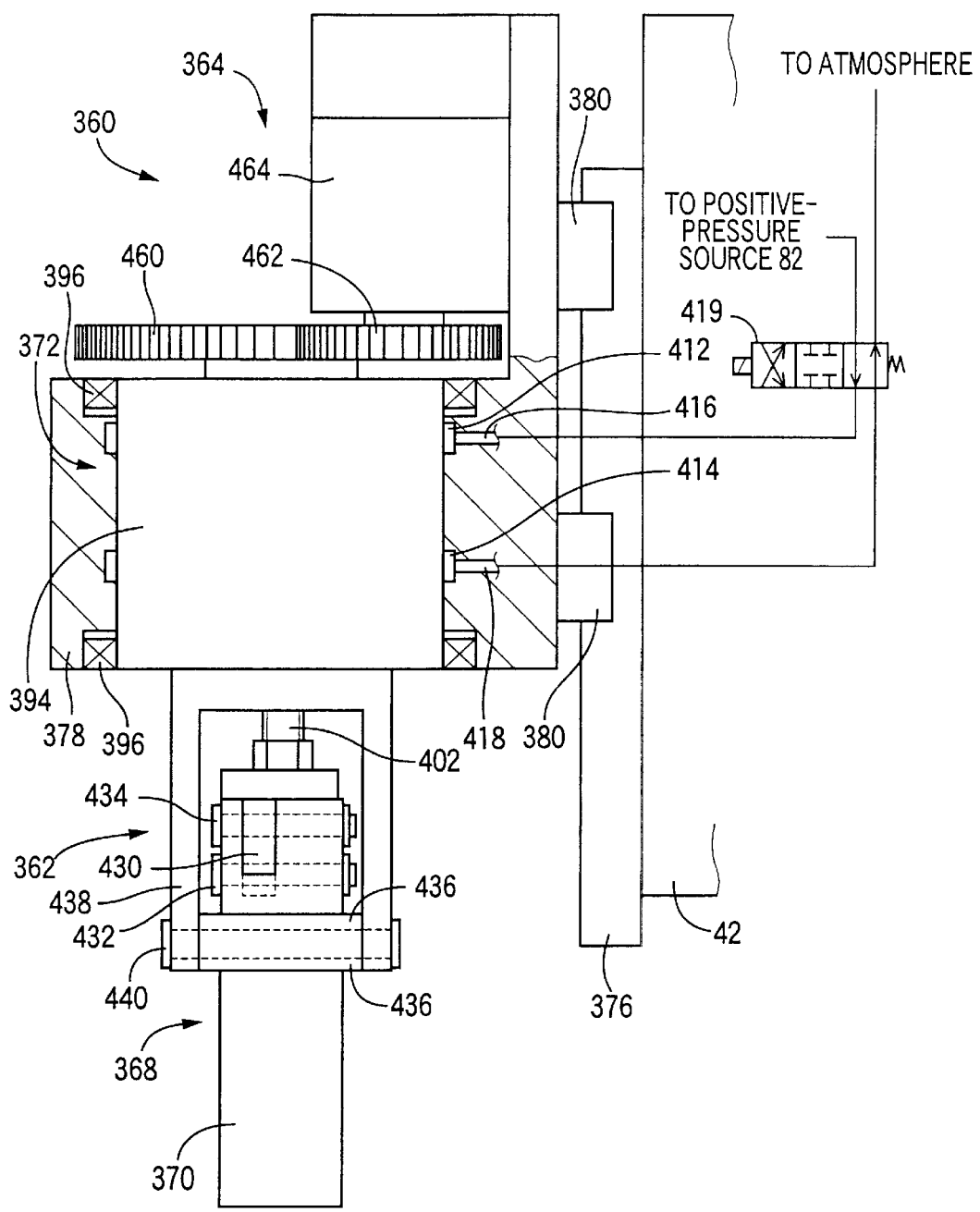
FIG. 10 is a partly cross-sectioned, rear elevation view of a holding unit including the holding head.
Figure 11:
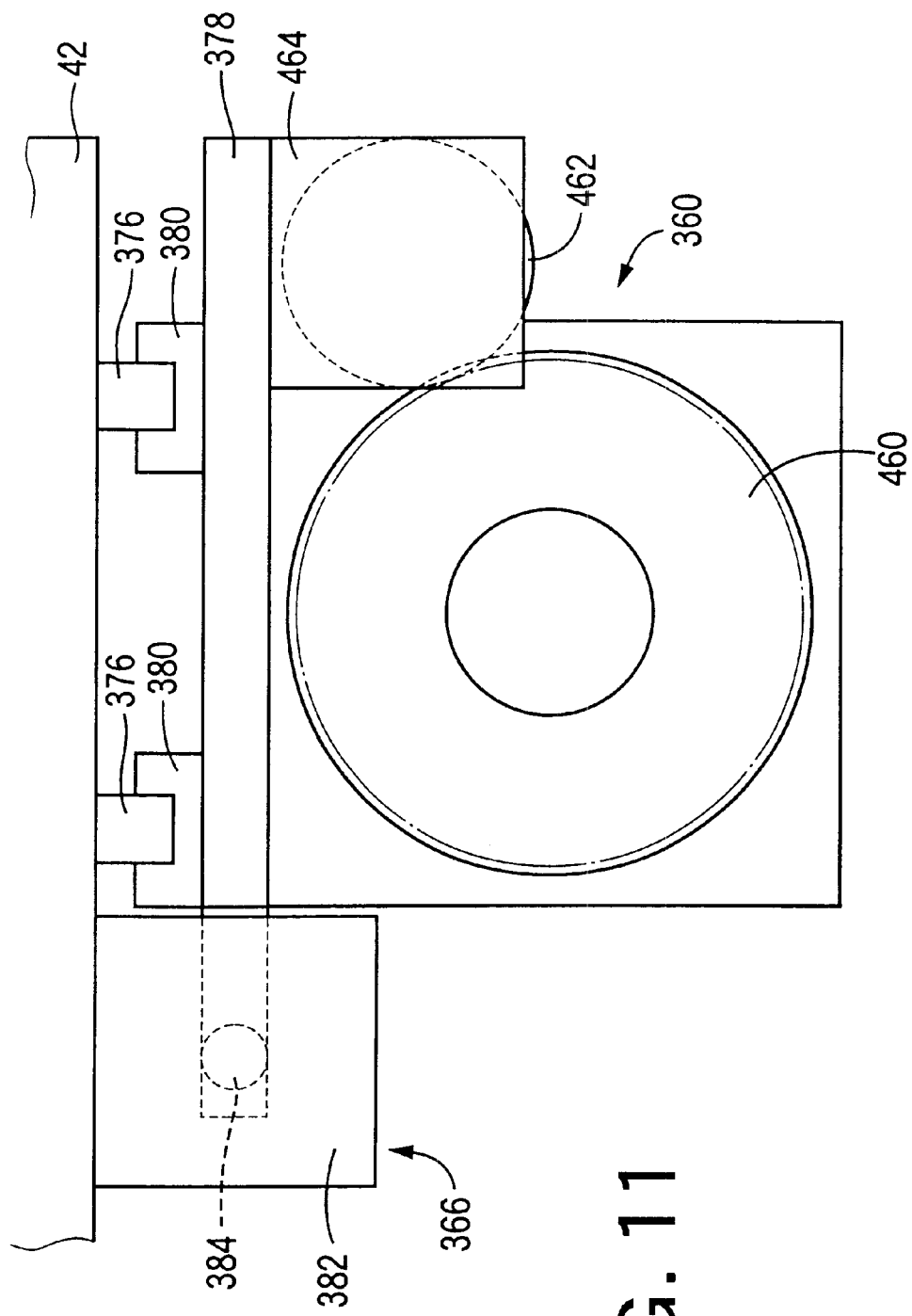
FIG. 11 is a plan view of the holding unit.

As shown in FIGS. 2 and 10, the vertical side surface 50 of the Y-axis table 42 supports a pair of guide rails 376 each as a guide member, such that the guide rails 376 are vertical, and an elevator table 378 fits via respective guide blocks 380 each as a guided member on the guide rails 376, such that the elevator table 378 is movable relative to the Y-axis table 42. In addition, the Y-axis table 42 supports a pressurized-air-operated cylinder device 382 as a pneumatic actuator as a sort of a pressurized-fluid-operated actuator as a drive source, such that the air-operated cylinder 382 is oriented downward. As shown in FIGS. 2 and 11, a piston rod 384 is engaged with the elevator table 378. Two air chambers of the air-operated cylinder 382 are selectively communicated with the positive-pressure source 82 and the atmosphere, respectively, or the atmosphere and the source 82, respectively, by a switching operation of a solenoid-operated direction-switch valve 386, so that the piston rod 384 is advanced or retracted and the elevator table 378 is lowered or elevated. Thus, the air-operated cylinder 382 and so on provides the elevating and lowering device 366. In the present embodiment, the direction-switch valve 386 is mounted on the Y-axis table 42, and is connected to the positive-pressure source 82 via the previously-described connector provided on the Y-axis table 42.

As shown in FIGS. 7 and 10, the elevator table 378 supports a pressurized-air-operated cylinder device 394 via bearings 396 such that the air-operated cylinder 394 is rotatable relative to the elevator table 378 about a vertical axis line and is not movable relative to the table 378 in an axial direction. A piston 400 air-tightly fits in a housing 398 of the air-operated cylinder 394, such that the piston 400 is movable in an axial direction. A piston rod 402 which is integral with the piston 400 projects downward from the piston 400, air-tightly through the wall of the cylinder housing 398, and extends out of the housing 398.

The piston 400 fits in the cylinder housing 398, so that two air chambers 404, 406 are provided on both sides of the piston 400, respectively, and are connected to the positive-pressure source 82 via respective ports 408, 410 formed in the housing 398, respective annular passages 412, 414 formed in the elevator table 378, respective passages 416, 418 (FIG. 10), and a solenoid-operated direction-switch valve 419. The direction-switch valve 419 is connected to the above-described connector and to the positive-pressure source 82. Thus, the two air chambers 404, 406 are communicated with the positive-pressure source 82 and the atmosphere, respectively, or vice versa, by a switching operation of the direction-switch valve 519, so that the piston 400 is moved and the piston rod 402 is advanced or retracted.

In the present embodiment, the various solenoid-operated direction-switch valves including the valve 68 are mounted on the Y-axis table 42, and the switching operations to switch the respective supplies of the positive pressure and the negative pressure to the various devices, including the EC mounting head 30, that are mounted on the Y-axis table 42 and need the positive pressure and the negative pressure are performed on the Y-axis table 42. Therefore, the distance between each of the direction-switch valves and a corresponding one of the devices that are operated based on the positive-pressure air or the negative pressure is short, and accordingly those devices exhibit a quick response.

Figure 8:
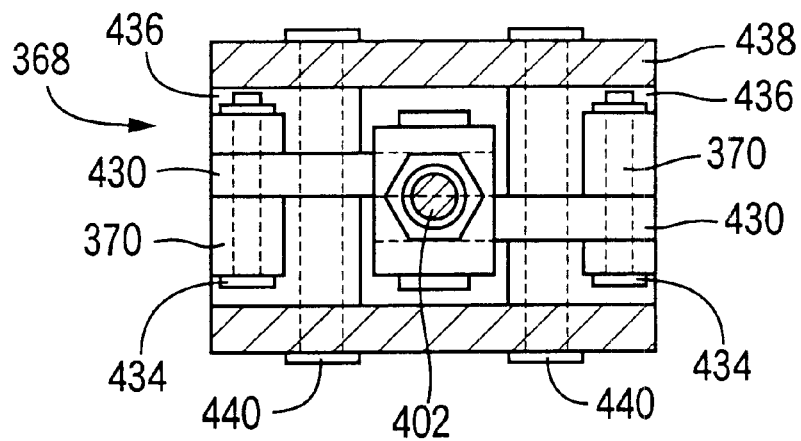
FIG. 8 is a cross-section view taken along 8—8 in FIG. 7.

As shown in FIG. 7, a pair of links 430 are attached, at respective one end portions thereof, to a lower end portion of the piston rod 402 via a pin 432, such that each of the links 430 is pivotable about a horizontal axis line. Respective other end portions of the links 430 are connected to the two grasping fingers 370 via respective pins 434, such that each of the fingers 370 is pivotable about a horizontal axis line. As shown in FIGS. 7 and 8, each of the two grasping fingers 370 includes an ear portion 436 at a position near to a corresponding one of the two links 430, and each of the respective ear portions 436 of the fingers 370 is pivotally connected to a corresponding one of two pins 440 supported by a bracket 438 which is integral with the cylinder housing 398.

Respective lower end portions of the two grasping fingers 370 are perpendicularly bent toward each other to provide respective engaging portions 444. As shown in FIG. 9, each of the engaging portions 444 has, at a free end thereof, a recess 446 having a V-shaped cross section. As shown in FIG. 7, an upper and a lower surface of each of the engaging portions 444 are inclined to provide respective inclined surfaces 448 each having an inclination corresponding to that of the inclined side surfaces 304 of the circular groove 302 of the neck portion 300, 337 of each holding pin 212 or each closing pin 330. The two grasping fingers 370 grasp the holding pin 212 or the closing pin 330 in such a manner that the respective engaging portions 444 enter and engage the circular groove 302 of the neck portion 300 or 337. In the present embodiment, the respective pairs of inclined surfaces 448 of the two engaging portions 444 engage the side surfaces 304 of the annular groove 302, and thereby grasp the holding pin 212 or the closing pin 330 without tilting the same 212, 330. The recess 446 of each of the two engaging portions 444 defines a V-shaped space which assures that the inclined surfaces 448 engage the side surfaces 304, and thereby grasp the neck portion 300 or 337, or grasp the pin 212 or 330 with a small clearance being left between the surfaces 448 and the neck portion 300, 337. Since the distance between the neck portion 300, and the seat surface 329, of each holding pin 212 is equal to the distance between the neck portion 337, and the bottom surface 338, of each closing pin 330, the pin holder 368 can hold both each holding pin 212 and each closing pin 330 in a same manner, though the two sorts of pins 212, 300 have different heights.

When the piston rod 402 is moved downward, the two grasping fingers 370 are pivoted, as indicated at two-dot-chain line, such that the respective engaging portions 444 are moved away from each other, so that the holding pin 212 or the closing pin 330 is released. On the other hand, when the piston rod 402 is moved upward, the two grasping fingers 370 are pivoted, as indicated at solid line, such that the respective engaging portions 444 are moved toward each other, so that the holding pin 212 or the closing pin 330 is grasped such that the pin 212 or 330 is coaxial with the axis line of the air cylinder 394, i.e., the axis line of the pin holder 368. Thus, the piston rod 402, the links 430, the grasping fingers 370, and the bracket 438 are so connected to one another that the grasping fingers 370 grasp and release the holding pin 212 or the closing pin 330 owing to a toggle mechanism. Thus, the pin 212, 330 is strongly grasped by the pin holder 368. In the present embodiment, the bracket 438 provides a main member of the pin holder 368 that cooperates with the links 430 and the grasping fingers 370 to provide the pin holder 368. The rotating device 364 which rotates the pin holder 368 is elevated and lowered with the holder 368 and so on. The air cylinder 394 and so on provide the finger drive device 372.

As shown in FIG. 7, a driven gear 460 is provided on an upper surface of the cylinder housing 398, such that the driven gear 460 is coaxial with the housing 398 and is not rotatable relative to the same 398. As shown in FIG. 11, the driven gear 460 is meshed with a drive gear 462 and, when the drive gear 462 is rotated by a rotating motor 464, the drive gear 462 is rotated, so that the air cylinder 394 is rotated about the vertical axis line and the pin holder 368 is rotated about the same vertical axis line. The rotating motor 464 are provided on the elevator table 378, and cooperates with the drive gear 462, the driven gear 460, and so on to provide the rotating device 364. The air chambers 404, 406 of the air cylinder 394 are supplied with the air via the respective annular passages 412, 414, so that even if the air cylinder 394 is rotated, the air chambers 404, 406 can continuously receive the air.

Figure 13:
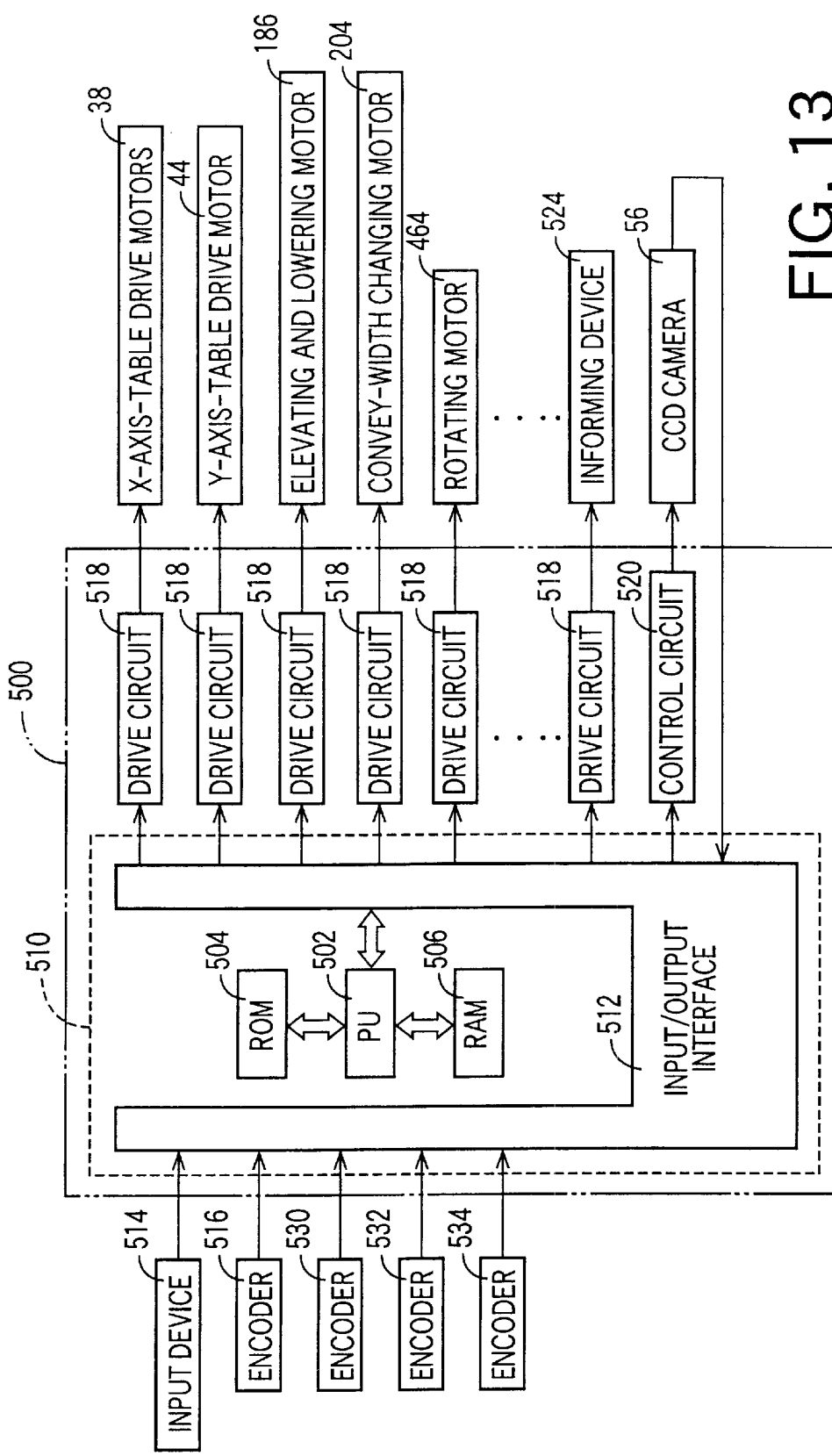
FIG. 13 is a diagrammatic view of a control device which controls the EC mounting system.

The present EC mounting system 12 is controlled by a control device 500 shown in FIG. 13. The control device 500 is essentially provided by a computer 510 including a PU (processing unit) 502, a ROM (read only memory) 504, a RAM (random access memory) 506, and a bus which connects those elements 502, 504, 506 to one another. An input/output interface 512 is connected to the bus of the computer 510, on one hand, and is connected, on the other hand, to the CCD camera 56, an input device 514, encoders 516, 530, 532, 534, etc. The encoders 516, 530, 532, 534 are respective rotation detecting devices which detect respective rotation angles of the X-axis-table drive motors 38, the Y-axis-table drive motor 44, the elevating and lowering motor 186, and the rotating motor 464. FIG. 13 shows the encoders 516, 530–534 provided for the motors 38, 44, 186, 464, as representatives of all the encoders that are provided for detecting respective rotation angles of all the motors employed in the present EC mounting system 12. The input device 514 includes ten keys, function keys, etc., and is operable by an operator to input various data.

Various actuators including the X-axis drive motors 38, the informing device 524, etc. are additionally connected via respective drive circuits 518 to the input/output interface 512, and the CCD camera 56 is connected via a control circuit 520 to the interface 512. Each of the motors, including the motors 38, is a servomotor as a sort of electric motor as a drive source. However, the servomotors may be replaced with a different sort of motors which can be controlled with respect to rotation angle or amount; for example, stepper motors. The informing device 524 may be an alarm, a lamp, or a display that informs an operator of the occurrence of abnormality, by alarming, lighting, or displaying. The drive circuits 518 and the control circuit 520 cooperate with the computer 510 to provide the control device 500.

Figure 17:
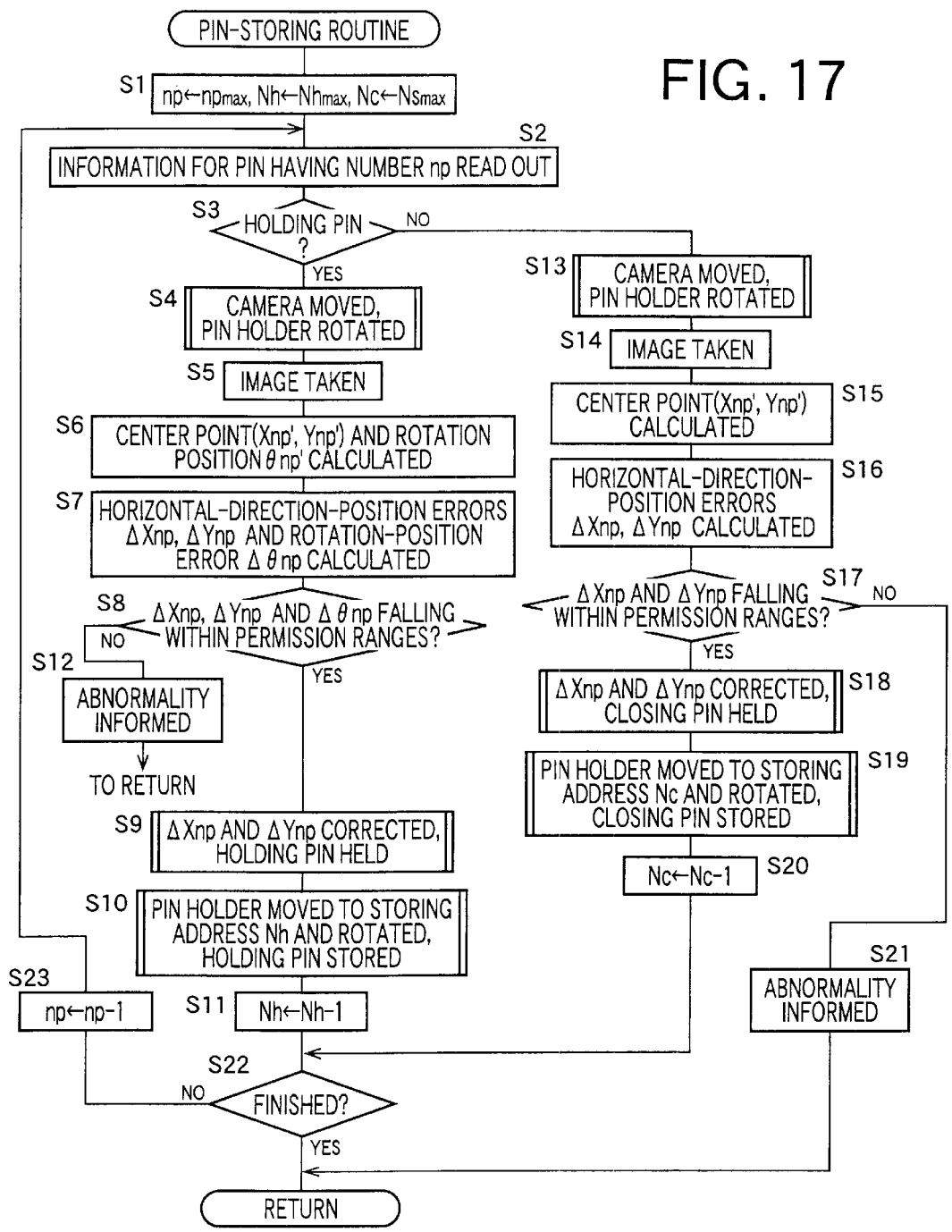
FIG. 17 is a flow chart representing a pin-storing routine stored in a ROM (read only memory) of a computer as an essential part of the control device.
Figure 18:
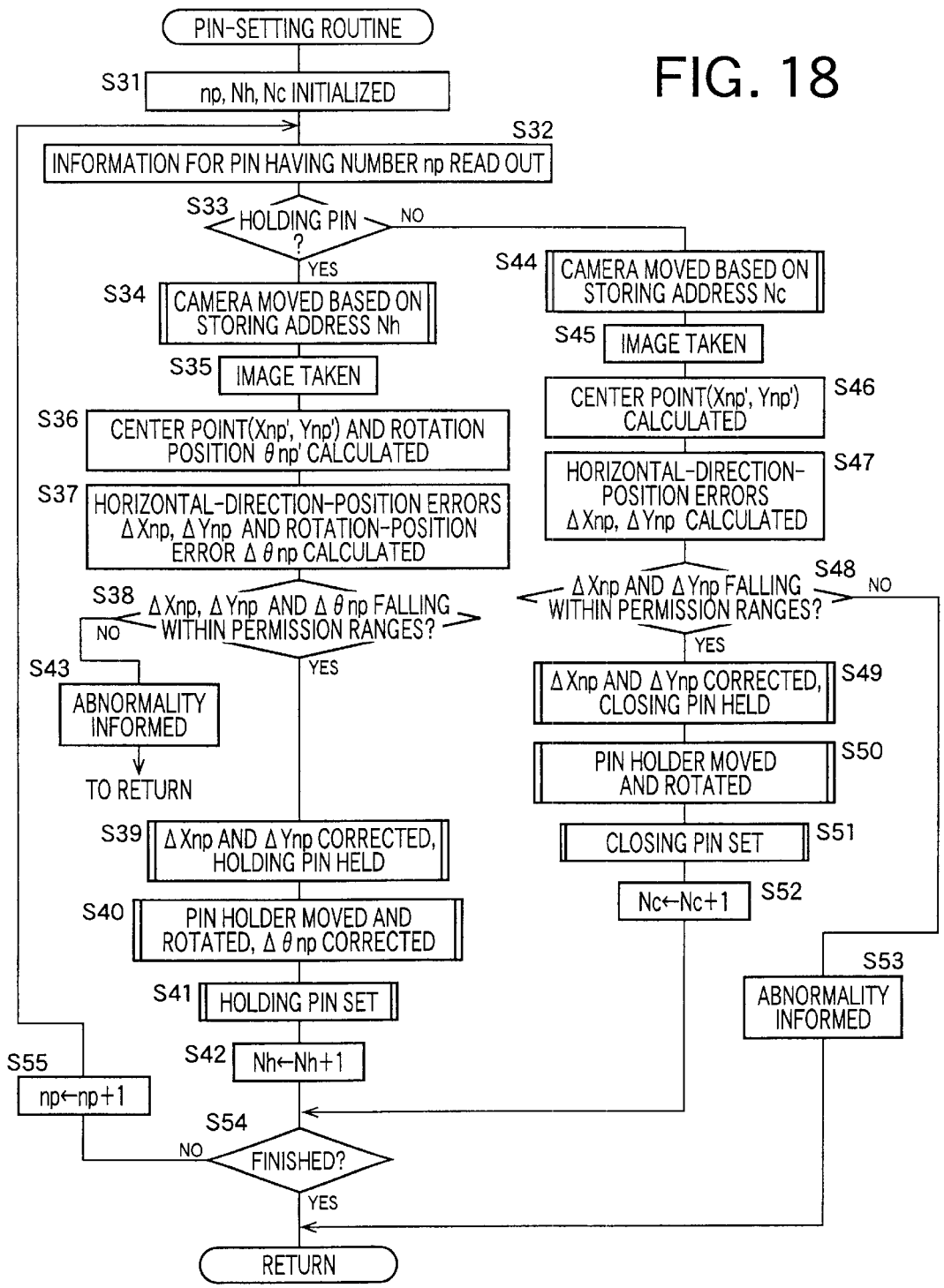
FIG. 18 is a flow chart representing a pin-setting routine stored in the ROM.
Figure 19:
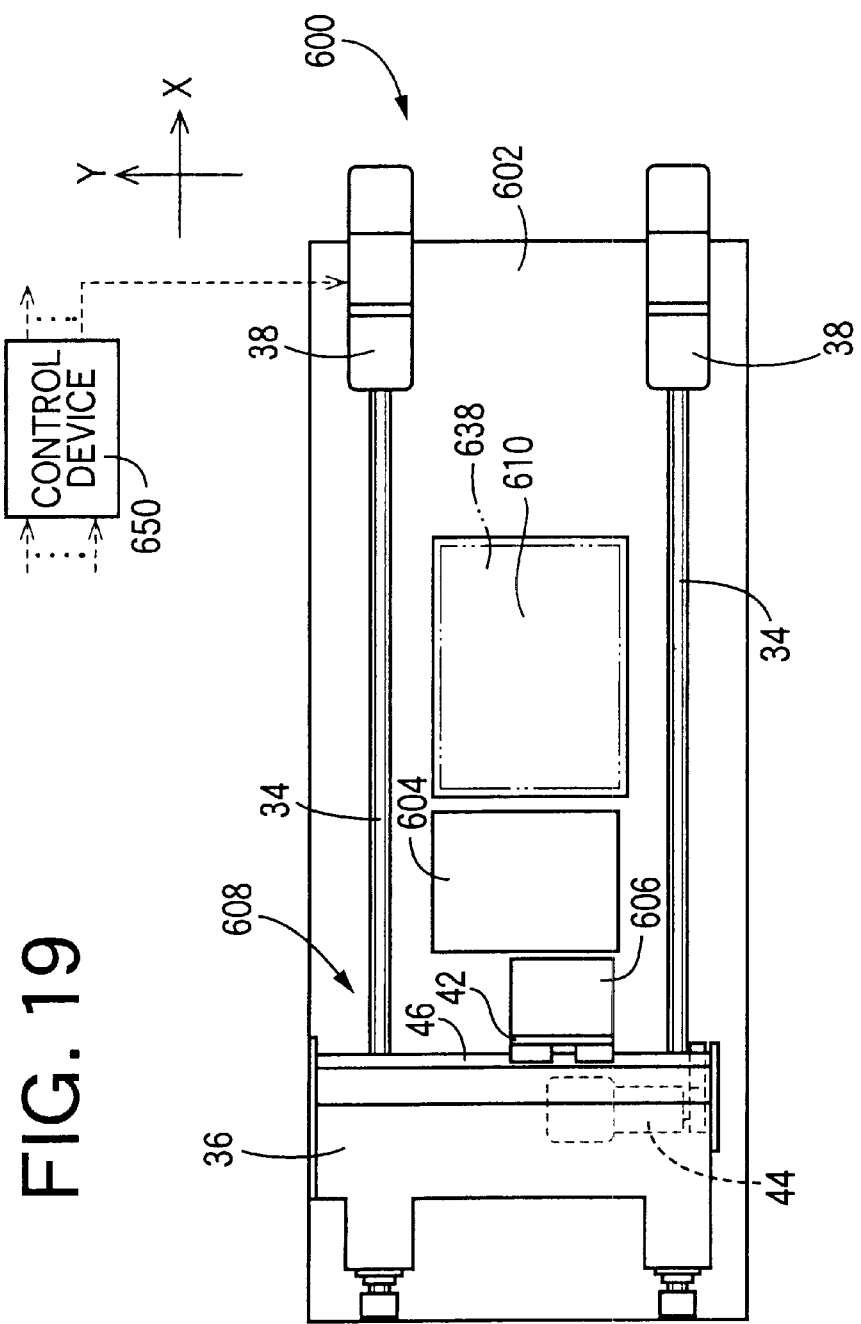
FIG. 19 is a plan view of another automatic resetting apparatus which advantageously carries out a PWB-holding-device setting method according to the present invention.

The ROM 504 stores a main routine, not shown; a pin-storing routine and a pin-setting routine which are represented by respective flow charts shown in FIGS. 17 and 18; and a plurality of sorts of manufacturing programs each as a program used for mounting ECs 32 on PWBs 24. The RAM 506 stores a plurality of batches of pin-setting information used for setting the holding pins 212 and the closing pins 330 on the holding table 210, and pin-storing information used for storing the pins 212, 330 in the storing device. The plurality of batches of pin-setting information correspond to a plurality of sorts of PWBs 24, respectively.

Each batch of pin-setting information includes data representing a total number of the holding pins 212 and the closing pins 330 that are to be set on the holding table 210. For each holding pin 212, in particular, the pin-setting information additionally includes data representing the sort of the each pin 212 (i.e., the fact that the each pin 212 is not a closing pin 330 but a holding pin 212); setting-position data representing a setting position where the each pin 212 is to be set on the upper surface 226 of the holding table 210; and rotation-position data representing a rotation position at which the each pin 212 is to be mounted on the upper surface 226. In the present embodiment, the upper surface 226 is a horizontal surface, and the setting-position data is horizontal-direction-position data representing a position, in a horizontal direction, where each holding pin 212 is to be set on the upper surface 226. The rotation position is an angular phase of each holding pin 212 about an axis line of the pin 286 thereof, e.g., a vertical axis line in the present embodiment, and defines a direction in which the elongate seat member 320 thereof extends. The pin-setting information includes, for each closing pin 330, data representing the sort of the each pin 330; horizontal-direction-position data representing a setting position where the each pin 330 is to be set; and rotation-position data representing a rotation position of a direction in which the two grasping fingers 370 of the pin holder 368 are opposed to each other. The setting position where each closing pin 330 is set can be said as a closing position where the each closing pin 330 closes one negative-pressure-supply hole 224. Since the permanent magnet 335 of each closing pin 330 has a cylindrical shape, it does not matter with the rotation position of the each closing pin 330. Therefore, the pin-setting information does not include rotation-position data representing a rotation position at which each closing pin 330 is to be set. However, when the pin holder 368 sets each closing pin 330 on the holding table 210 or resets each closing pin 330 from the holding table 210, the pin holder 368 must not interfere with the other holding or closing pins 212, 330. To this end, the pin-setting information includes rotation-position data representing a rotation position of the direction in which the two grasping fingers 370 of the pin holder 368 are opposed to each other to set or reset each closing pin 330.

In the present embodiment, the horizontal-direction position and rotation position of each holding pin 212 are so determined as to satisfy both a first condition given for the PWB 24 and a second condition given for the PWB holding device 174. The first condition is that each holding pin 212 can engage a portion of the PWB 24 that is free of the ECs 32 mounted thereon and is free of unevenness and the suction cup 310 can closely contact the PWB 24 without interfering with the ECs 32 mounted thereon. A batch of design data for each sort of PCB 24 includes data representing respective positions on the back surface of the PWB 24 where ECs 32 are to be mounted, and respective positions where the back surface of the PWB 24 has unevenness.

The above-indicated second condition is, for each holding pin 212, such that the seat member 320 of each holding pin 212 does not interfere with the seat members 320 and/or the permanent magnets 335 of the other holding and/or closing pins 212, 330, and closely contacts a portion of the upper surface 226 that surrounds the opening of one negative-pressure-supply hole 224, so as to cover completely the supply hole 224. Since the seat member 320 of each holding pin 212 is elongate and the pin 286 thereof is connected to the lengthwise middle portion of the seat member 320, the pin 286 can be positioned, on the holding table 210, at an arbitrary position within a circle whose radius is equal to the distance between the central axis of the pin 286 and the center of the hole 224 and whose center coincides with the center of the hole 224. The distance between the central axis of the pin 286 and the center of the hole 224 takes a maximal value when the hole 224 is aligned with one of opposite end portions of the seat member 320. Therefore, the pin 286 can be positioned at an arbitrary position within a circle whose radius is equal to the. maximal value. In the present embodiment, the respective circles associated with the plurality of negative-pressure-supply holes 224 overlap each other to cover substantially entirely the upper surface 226 of the holding table 210. Thus, the pin 286 of each holding pin 212 can be positioned at an arbitrary position on the upper surface 226 of the holding table 210. However, in the case where a plurality of holding pins 212 are set on the holding table 210, the respective seat members 320 and/or the permanent magnets 335 of the holding and/or closing-pins 212, 330 must not interfere with each other. This limits the respective positions where the holding pins 212 are set.

The closing pins 330 are used to close the other negative-pressure-supply holes 224 of the holding table 210 than the supply holes 224 to which the holding pins 212 are attached, respectively, and thereby prevent the leakage of negative pressure. Therefore, the setting positions where the closing pins 330 are set are the positions where the closing pins 330 closely contact respective portions of the upper surfaces 226 surrounding the respective openings of the other supply holes 224 to which the holding pins 212 are not attached, and thereby entirely cover those openings. As described above, each closing pin 330 is associated with a prescribed rotation position at which the pin holder 368 holds the each pin 330 to set or store the same 330. Each closing pin 330 needs, around the neck portion 337 thereof, such a space which assures that the two grasping fingers 370 are opened and closed, in at least one direction, to grasp the each pin 330. The setting position where each closing pin 330 is set is necessarily prescribed as being a position where a negative-pressure-supply hole 224 free of a holding pin 212 is present. Therefore, that each closing pin 330 has to have, around the neck portion 337 thereof, a space which assures that the two grasping fingers 370 can be opened and closed in at least one direction, is part of the second condition under which the respective horizontal-direction positions and respective rotation positions of the holding pins 212 are prescribed.

Thus, the horizontal-direction positions and rotation positions of the holding pins 212, and the horizontal-direction positions of the closing pins 330 as the setting positions thereof and the rotation positions of the pin holders 368 for the closing pins 330 are so prescribed automatically, or by an operator, as to satisfy both the condition given to the PWB 24 and the condition given to the PWB holding device 174.

Each of a plurality of holding pins 212 and a plurality of closing pins 214 which are to be set on the holding table 210 is given a pin number, np, and the pin-setting information includes, in association with each pin number np, the sort of a corresponding pin; and, for each holding pin 212, a horizontal-direction position and a rotation position thereof and, for each closing pin 330, a horizontal-direction position thereof and a rotation position of the pin holder 368, as schematically shown in FIG. 14. The horizontal-direction position of each holding or closing pin 212, 330 with pin number np is expressed by a set of x and y coordinates, ($X_{np}$, $Y_{np}$), of the center thereof (i.e., the axis line of the pin 286, 333 thereof); and the rotation position of each holding pin 212 or the pin holder 368 is expressed by an angle, $\theta_{np}$, of the lengthwise direction of the seat member 320 of the holding pin 212 or the direction in which the two grasping fingers 370 of the pin holder 368 are opposed to each other, as measured from a reference rotation position (i.e., an angle of 0 degree) parallel to the X-axis direction, in a clockwise or positive direction or in a counterclockwise or negative direction, under the condition that the holding pin 212 or the closing pin 330 is seen from the upper side (i.e., the side of the support surface 288). The sequential pin numbers np represent a prescribed setting order in which the holding and closing pins 212, 330 are to be set, irrespective of the sorts of the pins 212, 330, on the holding table 210. In the present embodiment, the setting order is so prescribed that the earlier pins 212, 330 are set, irrespective of the sorts of the pins 212, 330, at the remoter setting positions on the holding table 210 from the storing device 340.

Figure 15:
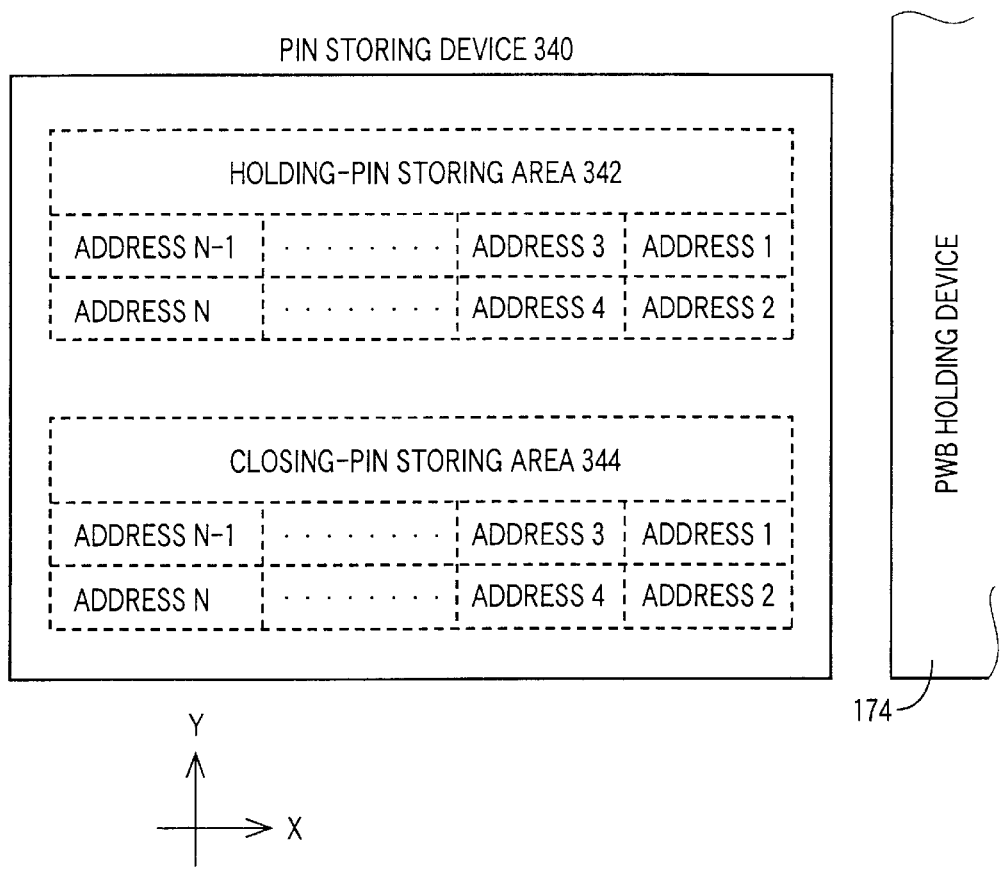
FIG. 15 is a view for explaining a manner in which the pins are stored in two storing areas provided in the storing device.

In the present embodiment, the pin-storing information is input by the operator through the input device 514, and is stored in the RAM 506. In the present embodiment, the pin-storing information includes an address where each holding pin 212 is stored in the storing area 342 of the storing device 340, or an address where each closing pin 330 is stored in the storing area 344 of the storing device 340. As schematically shown in FIG. 15, each of the storing positions in the holding-pin storing area 342 or the closing-pin storing area 344 of the storing device 340 is given an address, N. In the present embodiment, the smaller addresses N are given to the nearer storing positions to the PWB holding device 174. A relationship between each address N, and x and y coordinates representing a corresponding storing position is defined by a prescribed table which is stored in the ROM 504. The storing position represented by the x and y coordinates is a position taken by the axis line of the pin 286, 333 of each holding or closing pin 212, 330 in the storing device 340.

The holding-pin storing area 342 and the closing-pin storing area 344 store respective numbers of holding pins 212 and closing pins 330 that can hold each of a plurality of sorts of PWBs 24. Therefore, when the current sort of PWBs 24 on each of which ECs 32 are to be mounted are changed to a new sort of PWBs 24 and a resetting operation is performed to reset the PWB holding device 174, only the current pin-setting information is changed to new pin-setting information corresponding to the new sort of PWBs 24. As described previously, the holding pins 212 and the closing pins 330 are initially stored in the storing device 340, by the operator. More specifically described, the holding pins 212 or the closing pins 330 are stored in the respective consecutive addresses in the holding-pin storing area 342 or the closing-pin storing area 344, respectively, such that there are no empty addresses among the addresses filled with the pins 212, 330. The operator inputs, as the pin-storing information, the smallest address that is the nearest to the PWB holding device 174 and the largest address that is the remotest from the same 174.

In the EC mounting system 12 constructed as described above, ECs 32 are mounted on a PWB 24 according to one of the manufacturing programs which are stored in the ROM 504. The operator can select, through the input device 514, an appropriate one of the manufacturing programs. If a different manufacturing program has been used before the thus selected manufacturing program, a resetting operation is performed before the selected manufacturing program is carried out. The resetting operation includes changing the PWB-convey width of the PWB conveyor 22, exchanging the ECs 32 supplied by the EC supplying device 18, rearranging the holding and closing pins 212, 330 of the PWB holding device 174, and so on. After the resetting operation, ECs 32 are mounted on a PWB 24 according to the newly selected manufacturing program. Hereinafter, first, there will be described a manner in which the holding pins 212 and the closing pins 330 are attached to the holding table 210 to support the PWB 24 and ECs 32 are mounted on the PWB 24.

Figure 16:
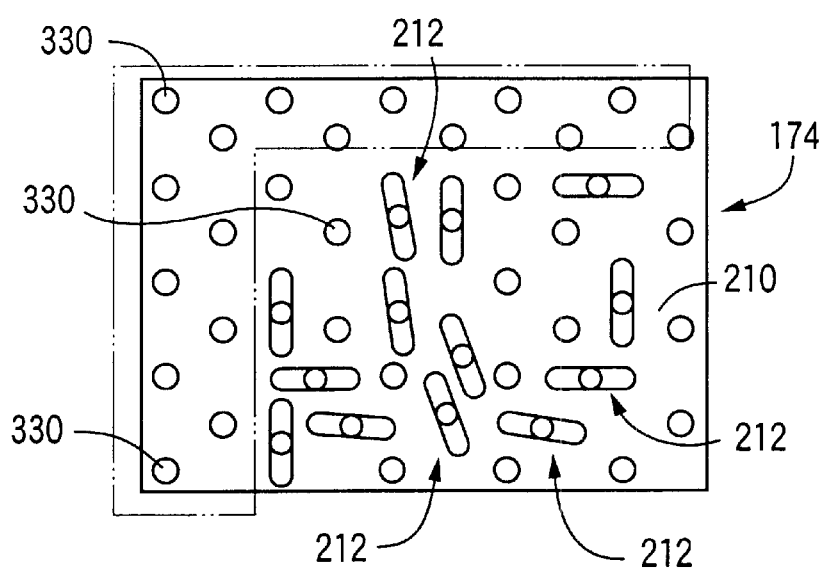
FIG. 16 is a schematic plan view showing a state in which the holding pins and the closing pins are set on the holding table of the PWB holding device.

As described previously, the lower or back surface 215 of the PWB 24, opposite to the upper or front surface thereof on which ECs 32 are to be mounted, has some ECs 32 already mounted thereon and some uneven portions. Thus, each pin 212, 330 must support one of limited portions of the back surface. Meanwhile, the holding table 210 is used commonly for a plurality of sorts of PWBs 24, and has a size greater than that of the largest one of the different sorts of PWBs 24. Thus, the holding pins 212 are not attached to all the negative-pressure-supply holes 224 and, as shown in FIG. 16, the holding table 210 includes a first area, indicated at two-dot-chain line, which is not aligned with the PWB 24 because the PWB 24 is smaller than the table 210 and to which no holding pins 212 are attached and only some closing pins 330 are attached, and a second area which is aligned with the PWB 24 and to which both holding and closing pins 212, 330 are attached.

Since the permanent magnets 328 are fixed to the seat member 320 of each holding pin 212 and the base 218 is formed of ferromagnetic material, the base 218 is magnetized when the holding pin 212 is set on the base 218, and accordingly the holding pin 212 is attracted and fixed to the holding table 210 by the magnetic force. Since the holding pin 212 is set on the holding table 210 such that the seat surface 329 of the container-like seat member 320 closely contacts a portion of the upper surface 226 that surrounds the opening of one negative-pressure-supply hole 224, the leakage of negative pressure through the supply hole 224 does not occur, and the negative-pressure passage 326 formed in the holding pin 212 communicates with the supply hole 224 so that negative pressure is supplied to the passage 326.

As shown in FIG. 4, each of the negative-pressure-supply holes 224 to which the holding pins 212 are not attached is closed by a closing pin 330. Since the closing portion 332 of each closing pin 330 is formed of a permanent magnet 335, the base 218 is magnetized when the closing pin 330 is set on the holding table 210, and accordingly the closing pin 330 is magnetically attracted and fixed to the holding table 210. Since the closing portion 332 closely contacts a portion of the upper surface 226 that surrounds the opening of one negative-pressure-supply hole 224 and closes the opening of the supply hole 224, the leakage of negative pressure through the supply hole 224 does not occur.

When ECs 32 are mounted on a WB 24, the PWB 24 is carried in by the PWB conveyor 22. At this time, the PWB holding device 174 is held at its downward-movement-end position by the PWB elevating and lowering device 170, so that the PWB 24 is carried in onto the PWB holding device 174, and contacted with, and stopped by, the stopper, not shown. Then, the holding device 174 is moved upward to its upward-movement-end position by the elevating and lowering device 170. When the PWB holding device 174 is moved upward, the solenoid-operated direction-switch valve, not shown, is switched to communicate the negative-pressure-supply holes 224 with the negative-pressure source 70, so that the negative pressure is supplied to the holding pins 212. Thus, the holding pins 212 are moved upward while sucking and holding the PWB 24. Eventually, the holding pins 212 lift up the PWB 24 off the conveyor belts 196, and press the same 24 against the PWB hold-down portions 194.

In the present embodiment, the distance of movement of the PWB holding device 174 is equal to a value which is obtained by subtracting the thickness of the PWB 24 from the distance between the hold-down portions 194 and the support surfaces 288 of the holding pins 212 positioned at their downward-movement-end position. The suction cups 320 are elastically deformed while sucking and holding the PWB 24. In the state in which the PWB holding device 174 is positioned at its upward-movement-end position, the support surfaces 288 of the holding pins 212 engage the PWB 24, cooperate with the hold-down portions 194 to sandwich the PWB 24, and support the lower surface of the PWB 24. Therefore, if the PWB 24 has an upwardly convex portion, the upward convex portion of the PWB 24 is sucked by the holding pins 212; and if the PWB 24 has a downwardly convex portion, the downward convex portion of the PWB 24 is pushed up by the support surfaces 288 of the holding pins 212. Thus, in either case, the PWB 24 is corrected to extend along a single plane, and the PWB holding device 174 holds the PWB 24 such that the PWB 24 takes a horizontal posture. When the PWB holding device 174 is elevated, the closing pins 330 are also elevated. However, the closing pins 330 do not contact the ECs 32 mounted on the back surface of the PWB 24, and continue to close the openings of the negative-pressure-supply holes 224 without preventing the holding pins 212 from holding the PWB 24. During a time duration in which the ECs 32 are mounted on the PWB 24, the negative pressure is continuously supplied to the holding pins 212. Consequently the PWB 24 is sucked and held by the holding pins 212 and is kept horizontal.

After the PWB holding device 174 is moved upward, the above-described clamping plates provided on the fixed and movable guides 188, 190 are moved upward by the clamping cylinders, so that the respective end portions of the PWB 24 are sandwiched and held by the clamping plates and the PWB hold-down portions 194.

After in this way the PWB 24 is held by the PWB holding device 174, the X-Y robot 48 moves the CCD camera 56 to a plurality of positions at each of which the CCD camera 56 is opposed to a corresponding one of a plurality of fiducial marks provided on the PWB 24. Based on a batch of image data representing the taken images of the fiducial marks, the computer 510 determines positional errors of the PWB 24 held by the holding device 174, and stores the determined positional errors in the RAM 506 thereof. Subsequently, the EC mounting head 30 picks up an EC 32 from the EC supplying device 18 and conveys the EC 32 to a position right above an EC-mount place on the PWB 24. During the conveying of the EC 32, the EC-image-taking CCD camera takes an image of the EC 32 held by the head 32 and, based on a batch of image data representing the taken image of the EC 32, the computer 510 determines positional errors of the EC 32 held by the head 32. Based on the positional errors of the PWB 24 and the positional errors of the EC 32, the computer 510 modifies the distance of movement of the EC 32, and controls the rotating device 54 to rotate the EC 32, so as to correct the positional errors of the PWB 24 and the EC 32. The positional errors of the center of the EC 32 produced by correcting the rotation-position error of the EC 32 are also corrected by modifying the distance of movement of the EC 32. After this correcting step, the EC 32 is mounted, at a correct rotation position, at a correct EC-mount place on the PWB 24.

After the ECs 32 are mounted on the PWB 24, the clamping plates are moved down to release the PWB 24, and the PWB holding device 174 is moved down to its downward-movement-end position. At this time, the supplying of negative pressure is stopped and is not supplied to the negative-pressure-supply holes 224, so that the holding pins 212 do not hold the PWB 24. When the lower surface of the PWB 24 is supported on the conveyor belts 196, the holding pins 212 are separated from the PWB 24. Then, the PWB 24 is carried out by the PWB conveyor 22, and another PWB 24 is carried in so that ECs 32 are mounted on the new PWB 24.

Hereinafter, a resetting operation for resetting the PWB holding device 174 will be described. Since the width of the PWB conveyor 22 is automatically changed and this change is not relevant to the present invention, the description thereof is omitted.

A PWB-holding-device resetting operation is automatically performed according to the pin-storing routine and the pin-setting routine shown in FIGS. 17 and 18 and based on the pin-setting information and the pin-storing information to set or store the holding pins 212 and the closing pins 330. The current group of holding pins 212 and closing pins 330 which are currently set on the holding table 210 are reset from the table 210, according to the current pin-setting information, and a new group of holding pins 212 and closing pins 330 are set on the table 210, according to new pin-setting information which is prescribed to set the PWB holding device 174 so that the holding device 174 holds a new sort of PWB 24 on which ECs 32 are to be mounted next.

A resetting operation is commenced in response to, e.g., a command input by an operator. When the computer 510 receives the resetting-commencement command, the computer 510 carries out the pin-storing routine and the pin-setting routine so that the automatic resetting apparatus 374 is operated to perform the resetting operation. When the computer 510 receives the resetting-commencement command, the computer 510 successively carries out both the pin-storing routine and the pin-setting routine, in a normal case. However, in a special case where only the storing, or only the setting, of the holding pins 212 and the closing pins 330 is commanded, the computer 510 operates for performing only the storing or only the setting according to that command. The resetting of the PWB holding device 174 is performed in a state in which the holding device 174 is positioned at its downward-movement-end position, the PWB 24 has been carried, by the PWB conveyor 22, out of the holding device 174, and a vacant space is present above the holding device 174. In addition, for the resetting operation, the movable guide 190 is moved away from the fixed guide 188, so that a maximal distance is present between the two guides 188, 190.

The storing and setting of the holding pins 212 and the closing pins 330 according to the pin-storing routine and the pin-setting routine are briefly described below.

In a resetting operation, after all the holding and closing pins 212, 330 currently attached to the holding table 210 are detached from the holding table 210 and returned to the storing device 340, appropriate holding and closing pins 212, 330 are taken out of the storing device 340 and re-attached to the holding table 210. The detaching of the holding and closing pins 212, 330 is performed according to the pin-setting information and the pin-storing information. The pin-storing information has been input by the operator and stored in the RAM 506, and is commonly used for different pin-setting states of the PWB holding device 174 that have different patterns of pin-setting positions, respectively. On the other hand, the pin-setting information is for setting the holding and closing pins 212, 330 on the holding table 210 to hold the PWBs 24 on each of which the ECs 32 have been mounted, and has been stored in the RAM 506. The holding and closing pins 212, 330 are detached from the holding table 210, in an order reverse to the order in which those pins 212, 330 had been attached to the same 210.

When each holding or closing-pin 212, 330 is stored, an image of the fiducial mark 294, 339 of the each pin 212, 124 is taken by the CCD camera 56. Based on the taken image, respective actual horizontal-direction positions of the each pin 212, 124 in the X-axis and Y-axis directions on a horizontal plane are calculated by the computer 510, and respective errors of the actual horizontal-direction positions of the each pin 212, 124 from respective nominal horizontal-direction positions thereof are determined. If at least one of the thus determined horizontal-direction-positional errors is greater than a prescribed amount, the informing device 524 informs the operator of occurrence of an abnormality. For each holding pin 212, additionally, an actual rotation position of the each pin 212 is calculated based on the image of the fiducial line 298, and an error of the actual rotation position of the each pin 212 from a nominal rotation position thereof is determined. If the rotation-positional error is greater than a prescribed amount, the informing device 524 informs the operator of occurrence of an abnormality. On the other hand, if each of the horizontal-direction-positional errors and the rotation-positional error of each pin 212, 330 is not greater than the corresponding prescribed amount, then the pin holder 368 is stopped at a position which has been corrected based on the horizontal-direction-positional errors, so that the pin holder 368 grasps the each pin 212, 330, detaches and conveys the same, and finally stores the same in the storing device 340. When the pin holder 368 holds each holding pin 212, the holder 368 is positioned at the same rotation position as the current rotation position of the each pin 212; and when the holder 368 holds each closing pin 330, the holder 368 is positioned at a prescribed rotation position where the holder 368 cannot interfere with the other pins 212, 330. When the pin holder 368 stores each holding pin 212 in the storing device 340, the holder 368 positions the each pin 212 to a prescribed storage rotation position; and when the holder 368 stores each closing pin 330 in the storing device 340, the holder 368 positions itself to a prescribed storage rotation position.

When a resetting command is present, after all the current holding and closing pins 212, 330 are stored in the storing device 340, the computer 510 carries out the pin-setting routine to set, according to a new batch of pin-setting information, a new group of holding and closing pins 212, 330 to support a new sort of PWB 24. This pin-setting information is for setting the new holding pins 212 to support the new PWB 24 on which ECs 32 are to be mounted, and the new closing pins 330 to close the remaining negative-pressure-supply holes 224, and has been stored in the RAM 506. The pin holder 368 is moved to the storing device 340, to hold the new holding and closing pins 212, 330. Before each of the new holding and closing-pins 212, 330 is taken out of the storing device 340, an image of the fiducial marks 294, 339 and the fiducial line 298 of the each pin 212, 330 is taken by the CCD camera 56 and, based on the taken image, respective actual horizontal-direction positions of the each pin 212, 330 in the X-axis and Y-axis directions on the horizontal plane, and an actual rotation position of each holding pin 212 are calculated by the computer 510, and respective errors of the actual horizontal-direction positions of the each pin 212, 330 from respective nominal horizontal-direction positions thereof and an error of the actual rotation position of the each holding pin 212 from a nominal rotation position thereof are determined. If at least one of the thus determined horizontal-direction-positional errors and rotation-positional error is greater than a corresponding prescribed amount, the informing device 524 informs the operator of occurrence of an abnormality. On the other hand, if each of the horizontal-direction-positional errors and the rotation-positional error of each pin 212, 330 is not greater than the corresponding prescribed amount, then the pin holder 368 is moved to, and stopped at, a position which has been corrected based on the horizontal-direction-positional errors, so that the pin holder 368 grasps the each pin 212, 330. When the pin holder 368 grasps each pin 212, 330, the holder 368 is positioned at a prescribed rotation position. Then, the pin holder 368 is moved toward the holding table 210, according to the pin-setting information, to set the each pin 212, 330 on the table 210. For each holding pin 212, the pin holder 368 is rotated to correct the rotation-positional error of the each pin 212, so that the each pin 212 is set at a prescribed rotation position thereof on the holding table 210. For each closing pin 330, the pin holder 368 is rotated to a prescribed rotation position thereof, to prevent the two grasping fingers 370 from interfering with the other holding or closing pins 212, 330.

Next, there will be described in detail the storing and setting of the holding pins 212 and the closing pins 330 according to the pin-storing routine and the pin-setting routine shown in FIGS. 17 and 18.

If a PWB-holding-device resetting command is received by the computer 510, first, the pin-storing routine is carried out by the same 510. At Step S1 (hereinafter, simply referred to as S1; this applies to the other steps), a pin number np, a holding-pin-storing address Nh, and a closing-pin-storing address Nc are initialized by the computer 510. In the present embodiment, the holding and closing-pins 212, 330 which are attached to the holding table 210 are detached from the table 210 in an order reverse to an order in which those holding and closing pins 212, 330 are attached to the table 210, and are stored in the storing device 340 in an order reverse to an order in which those holding and closing pins 212, 330 are taken out. The order in which the holding and closing pins 212, 330 are taken out is predetermined such that the pins 212, 330 stored at the nearer storing positions to the PWB holding device 174 (i.e., the storing positions having the smaller addresses) are earlier taken out. Therefore, the pins 212, 330 set on the holding table 210 at the nearer setting positions to the storing device 340 are earlier detached, and are earlier stored in the storing device 340 at the remoter storing positions from the holding table 210 (i.e., the storing positions having the greater addresses). At S1, np, Nh, and Nc are initialized to $np_{max}$, $Nh_{max}$, and $Nc_{max}$, respectively. The symbol, $np_{max}$, means the total number of pins 212, 330 currently set on the holding table 210, and is obtained from the current pin-setting information. The symbol, $Nh_{max}$, means the greater one of the greater and smaller pin-storing addresses which cooperate with each other to define a current pin-storing range in the holding-pin storing area 342, and is obtained from the pin-setting information; and the symbol, $Nc_{max}$ means the greater one of the greater and smaller pin-storing addresses which cooperate with each other to define a current pin-storing range in the closing-pin storing area 344, and is obtained from the pin-setting information.

Next, at S2, information relating the pin having the pin number np is obtained from the pin-setting information. The different sorts of pins are currently attached to the holding table 210. If the pin having the pin number $np_{max}$ is a holding pin 212, information relating to the holding pin 212 having the pin number np, i.e., data representing that the pin is a holding pin 212, a horizontal-direction-position coordinates (Xnp, Ynp) representing a setting position where the holding pin 212 is to be set on the holding table 210, and a rotation position θ np are read out from the RAM 506. Meanwhile, if the pin having the pin number np is a closing pin 330, information relating to the closing pin 330 having the pin number np, i.e., data representing that the pin is a closing pin 330, a horizontal-direction-position coordinates (Xnp, Ynp) representing a setting position where the closing pin 330 is to be set on the holding table 210, and a rotation position θ np to which the pin holder 368 is to be rotated when holding the pin 330 to store the same 330 are read out from the RAM 506.

Then, at S3, it is judged whether the pin having the pin number np is a holding pin 212, based on the information read out at S2. If the current pin is a holding pin 212, a positive judgment is made at S3, and the control goes to S4 where, based on the horizontal-direction-position data representing the current horizontal-direction position of the holding pin 212, the holding unit 360 is moved by the X-Y robot 48, so that the pin holder 368 can hold the holding pin 212. However, before the pin holder 368 holds the holding pin 212, an image of the support surface 288 of the pin 212 is taken by the CCD camera 56. Since the CCD camera 56 is mounted together with the holding unit 360 on the Y-axis table 42, the camera 56 is moved with the unit 360. To this end, the X-Y robot 48 is controlled so that the axis line of the pin holder 368 (i.e., the axis line of the air cylinder 394) is positioned at prescribed X and Y coordinates as the horizontal-direction position of the holding pin 212. Therefore, at S4, the holding unit 360 is moved to X and Y coordinates which have been modified by correcting the prescribed X and Y coordinates by respective offset amounts between the axis line of the pin holder 368 and the optical axis of the CCD camera 56. Consequently the optical axis of the CCD camera 56 is positioned at the prescribed X and Y coordinates where the camera 56 is positioned right above the support surface 288 of the holding pin 212.

The pin holder 368 of the holding head 362 is rotated, at S4, by the rotating device 364 while the CCD camera 56 is moved. The pin holder 368 is rotated according to the rotation position θ np read out at S2, so that the rotation position of the direction in which the two grasping fingers 370 are opposed to each other coincides with the rotation position θ np, i.e., that direction is parallel to the lengthwise direction of the seat member 320 of the holding pin 212.

After the movement of the CCD camera 56, the control goes to S5 where an image of the support surface 288 is taken, and respective images of the fiducial mark 294 and the fiducial line 298 are obtained. S5 is followed by S6 where, based on the image of the fiducial mark 294 obtained from the image taken by the CCD camera 56, X and Y coordinates (Xnp', Ynp') of the center point of the support surface 288 are calculated by a known technique and, based on the image of the fiducial line 298, a rotation position θ np' of the holding pin 212 is calculated by a known technique. The calculation of X and Y coordinates (Xnp', Ynp') of the center point of the support surface 288 is carried out by taking the offset amounts between the axis line of the pin bolder 368 and the optical axis of the CCD camera 56 into consideration. Then, at S7, horizontal-direction-position errors $\Delta Xnp$, $\Delta Ynp$ of the center point as respective X-axis-direction and Y-axis-direction (i.e., horizontal-direction) positional errors thereof, and a rotation-position error $\Delta\theta$ np as a rotation-direction positional error thereof are calculated. The horizontal-direction-position errors $\Delta Xnp$, $\Delta Ynp$ may be obtained by subtracting, from the calculated X and Y coordinates (Xnp', Ynp'), X and Y coordinates (Xnp, Ynp) as horizontal positions prescribed for the holding pin 212. The thus obtained errors $\Delta Xnp$, $\Delta Ynp$, each having a plus or minus sign, are stored in the RAM 506. The rotation-position error $\Delta\theta$ np is an angular error which may be obtained by subtracting, from a rotation angle representing the calculated rotation position $\theta$ np', a rotation angle representing a rotation position $\theta$ np prescribed for the holding pin 212. The rotation-position error $\Delta\theta$ np , having a plus or minus sign, is also stored in the RAM 506.

Next, at S8, it is judged whether the horizontal-direction-position errors $\Delta Xnp$, $\Delta Ynp$ and the rotation-position error $\Delta\theta$ np fall within respective permission ranges. This judgment may be made by comparing respective absolute values of the errors $\Delta Xnp$, $\Delta Ynp$, $\Delta\theta$ np with respective reference values. If at least one of the respective absolute values of the errors $\Delta Xnp$, $\Delta Ynp$, $\Delta\theta$ np is greater than a corresponding one of the respective reference values, an abnormality is identified, and a negative judgment is made at S8. In this case, the control goes to S12 where the informing device 556 informs the operator of the occurrence of abnormality. The current resetting operation is interrupted. On the other hand, if each of the respective absolute values of the errors $\Delta Xnp$, $\Delta Ynp$, $\Delta\theta$ np is not greater than the corresponding one of the respective reference values, a positive judgment is made at S8, and the control goes to S9 where the pin holder 368 holds the holding pin 212.

When the holding pin 212 is held, first, the holding unit 360 is moved by the X-Y robot 48 according to the horizontal-position data for the holding pin 212, so that the pin holder 368 is positioned above the pin 286 of the holding pin 212. The positions to which the unit 360 is moved are corrected based on the horizontal-direction errors $\Delta Xnp$, $\Delta Ynp$ calculated at S7, so that the axis line of the pin holder 368 coincides with the axis line of the pin 286. Thus, even if the holding pin 212 may have the horizontal-direction errors $\Delta Xnp$, $\Delta Ynp$, the pin holder 368 can accurately hold the pin 212.

After the holding unit 360 is moved, the holding head 362 is moved downward by the elevating and lowering device 366, so that the pin holder 368 is moved downward. When the pin holder 368 is lowered, the two grasping fingers 370 are kept opened and, in a state in which the pin holder 368 is positioned at its downward-movement-end position, the two grasping fingers 370 are positioned on both sides of the neck portion 300 of the holding pin 212, as indicated at two-dot chain line in FIG. 7. After the pin holder 368 is lowered, the two grasping fingers 370 are closed, so that the engaging portions 444 enter the circular groove 302 and the inclined surfaces 448 engage the side surfaces 304, as shown in FIGS. 7 and 9. Thus, the pin holder 368 holds the holding pin 212.

As described previously, the pin holder 368 is rotated while the CCD camera 56 is moved to the position right above the holding pin 212, so that the direction in which the two grasping fingers 370 are arranged is parallel to the lengthwise direction of the seat member 320. Therefore, when the pin holder 368 is lowered to hold the holding pin 212, the two grasping fingers 370 are aligned with the seat member 320 in a direction parallel to the widthwise direction of the holding pin 212. Thus, the grasping fingers 370 are prevented from interfering with the holding and/or closing pins 212, 330 adjacent to the holding pin 212. That is, when the pin holder 368 holds the holding pin 212, the pin holder 368 is rotated to the rotation position prescribed for the pin 212. Even if the holding pin 212 may have the rotation-position error $\Delta\theta$ np, the grasping pins 370 are not largely deviated from the seat member 320 and do not interfere with the adjacent holding and/or closing pins 212, 330, when the error $\Delta\theta$ np falls within the corresponding permission range and allows a positive judgment to be made at S8. However, when the pin holder 368 holds the holding pin 212, the rotation position of the holder 368 may be corrected based on the rotation-position error $\Delta\theta$ np .

After the two grasping fingers 370 grasp the holding pin 212, the elevator table 378 is elevated to move the pin holder 368 upward, so that the holding pin 212 is separated from the holding table 210 against the magnetic force exerted thereto and is lifted up. The respective engaging portions 444 of the two grasping fingers 370 enter the circular groove 302, and the respective inclined surfaces 448 engage the respective side surfaces 304. Thus, the elongate holding pin 212 is held by the pin holder 368 such that the holding pin 212 is not inclined even in the state in which the pin 212 is separate from the holding table 210.

Next, at S10, the pin holder 368 is moved to transfer the holding pin 212 to the storing device 340 and store the same at the prescribed pin-storing position having the address Nh in the holding-pin storing area 342. The pin-storing address Nh is associated with X and Y coordinates corresponding to the prescribed pin-storing position. The pin holder 368 is moved to the X and Y coordinates. While the pin holder 368 is thus moved, the pin holder 368 is rotated to change the rotation position of the holding pin 212 to a rotation position at which the holding pin 212 is to be stored in the storing device 340, e.g., a rotation position at which the lengthwise direction of the seat member 320 is parallel to the X-axis direction. Since the rotation-position error $\Delta\theta$ np of the holding pin 212 has been calculated based on the image taken by the CCD camera 56, the pin holder 368 is rotated based on the rotation position $\theta$ np at which the holding pin 212 had been set on the holding table 210, the rotation-position error $\Delta\theta$ np, and the rotation position at which the holding pin 212 is to be stored, so that the holding pin 212 is stored in the storing device 340 such that the seat member 320 of the pin 212 is parallel to the X-axis direction.

After the pin holder 368 is moved to the pin-storing position having the address Nh, the pin holder 368 is lowered to its downward-movement-end position where the holding pin 212 is stored in the storing device 340. Since the height position of the support surface of the storing device 340 that supports the seat surface of the holding pin 212 is equal to that of the upper surface 226 of the holding table 210 of the PWB holding device 174 being positioned at its downward-movement-end position, the seat member 320 of the holding pin 212 fits, when the pin holder 368 is lowered, in one recess formed in the support surface of the storing device 340, so that the holding pin 212 is stored in the storing device 340 such that the seat surface of the holding pin 212 is supported by the support surface. After the pin holder 368 is lowered, the two grasping fingers 370 are opened to release the holding pin 212. After the pin holder 368 releases the holding pin 212, the pin holder 368 is moved upward.

After the holding pin 212 is stored, the control goes to S11 where the holding-pin storing address Nh is decreased by one and then, the control goes to S22 to judge whether the current pin-storing operation has been finished, i.e., whether all the holding and closing-pins 212, 330 set on the holding table 210 have been stored in the storing device 340. This judgment is made by, e.g., judging whether the pin number np is equal to one. This judgment is negative till all the holding and closing-pins 212, 330 are stored in the storing device 340, and the control goes to S23 to decrease the pin number np by one, and then goes back to S2.

If the next pin having the next number np is a closing pin 330, a negative judgment is made at S3, and the control goes to S13 and the following steps. It does not matter with the rotation position of each closing pin 330 itself, and the closing pin 330 is not associated with a rotation position θ. Therefore, each closing pin 330 is stored like each holding pin 212 is stored, except that for the closing pin 330, no actions are taken in connection with rotation positions. More specifically described, at S13, when the CCD camera 56 is moved to a position right above the closing pin 330, the pin holder 368 is rotated to a rotation position at which the pin holder 368 is to store the closing pin 330, that is, a rotation position, represented by the pin-setting information, at which the two grasping fingers 370 do not interfere, when being opened and closed, with the holding and/or closing pins 212, 330 adjacent to the closing pin 330. Then, at S14, only an image of the fiducial mark 339 of the closing pin 330 is taken and, at S15, X and Y coordinates (Xnp', Ynp') of a center point of the pin 330 are calculated. Then, at S16, horizontal-direction-position errors ΔXnp, ΔYnp are calculated and, at S17, it is judged whether the horizontal-direction-position errors ΔXnp, ΔYnp fall within respective permission ranges. If at least one of the errors ΔXnp, ΔYnp does not fall within a corresponding one of the permission ranges, a negative judgment is made at S17, and the control goes to S21 where the operator is informed of the occurrence of abnormality.

If each of the horizontal-direction-position errors ΔXnp, ΔYnp falls within the corresponding one of the permission ranges, a positive judgment is made at S17, and the control goes to S18 where the positions at which the pin holder 368 is to be stopped are modified based on the errors ΔXnp, ΔYnp. Then, the pin holder 368 is moved to a position right above the closing pin 330, holds the pin 330, and lifts up the same 330 from the holding table 210. Subsequently, at S19, the pin holder 368 is moved to store the closing pin 330 at the position having the closing-pin storing address Nc in the closing-pin storing area 344. During this movement, the pin holder 368 is rotated so that the direction in which the two grasping fingers 370 are arranged is parallel to the X-axis direction. Thus, the pin holder 368 stores the closing pin 330 in the closing-pin storing area 344, without interfering with the closing pins 330 stored in the addresses adjacent to the address Nc. Then, at S20, the closing-pin storing address Nc is decremented by one. S2 to S11, S13 to S20, S22, and S23 are repeated till all the holding and closing pins 212, 330 are returned to the storing device 340.

If all the holding and closing-pins 212, 330 have been returned to the storing device 340, a positive judgment is made at S22, and the pin-storing routine is finished. Then, the computer 510 carries out the pin-setting routine to set the holding pins 212 and the closing pins 330 on the holding table 210. At S31 of the pin-setting routine, the pin number np, the holding-pin storing address Nh, and the closing-pin storing address Nc are initialized. More specifically described, the pin number np is initialized to one, and the two addresses Nh, Nc are initialized to the respective smaller ones of the respective greater and smaller addresses defining the respective address ranges in which the holding pins 212 and the closing pins 330 are stored in the holding-pin storing area 342 and the closing-pin storing area 344, respectively. Thus, the pins 212, 330 stored at the nearer addresses in the storing areas 342, 344 to the PWB holding device 174 are earlier taken out of the storing device 340. Then, at S32, information relating the pin having the pin number np is obtained from the pin-setting information. Next, at S33, it is judged whether the pin having the pin number np is a holding pin 212. If the current pin is a holding pin 212, a positive judgment is made at S33, and the control goes to S34 where the CCD camera 56 is moved to the storing position having the holding-pin storing address Nh. After the movement of the CCD camera 56, the control goes to S35 where an image of the support surface 288 of the holding pin 212 is taken by the camera 56.

Then, at S36, based on the image of the fiducial mark 294 obtained from the image taken by the CCD camera 56, X and Y coordinates (Xnp', Ynp') of the center point of the support surface 288 are calculated and, based on the image of the fiducial line 298, a rotation position θ np' of the holding pin 212 is calculated. After those calculations, the control goes to S7 where horizontal-direction-position errors ΔXnp, ΔYnp and a rotation-position error Δθ np of the holding pin 212 are calculated. Next, at S38, it is judged whether the horizontal-direction-position errors ΔXnp, ΔYnp and the rotation-position error Δθ np fall within the respective permission ranges, like at S8. If at least one of the errors ΔXnp, ΔYnp, Δθ np does not fall within a corresponding one of the respective permission ranges, a negative judgment is made at S38. In this case, the control goes to S43 where the informing device 556 informs the operator of the occurrence of abnormality. The current resetting operation is interrupted.

On the other hand, if each of the respective errors ΔXnp, ΔYnp, Δθ np falls within the corresponding one of the permission ranges, a positive judgment is made at S38, and the control goes to S39 where the pin holder 368 is moved to a position right above the pin 286 of the holding pin 212 to hold the holding pin 212. To this end, prescribed horizontal-direction-position coordinates (Xnh, Ynh) corresponding to the holding-pin storing address Nh are modified based on the horizontal-direction-position errors ΔXnp, ΔYnp, and the pin holder 368is moved to the thus modified horizontal-direction-position coordinates. Therefore, the axis line of the pin holder 368 coincides with the axis line of the pin 286, even if the holding pin 212 may have some horizontal-direction-position errors. Thus, the pin holder 368 can accurately hold the holding pin 212. When the pin holder 368 takes each holding pin 212 out of the storing device 340, the pin holder 368 is rotated to a prescribed rotation position, e.g., a rotation position at which the direction of arrangement of the two grasping fingers 370 is parallel to the X-axis direction. Thus, the pin holder 368 is prevented from interfering with the holding pins 212 stored at the addresses adjacent to the address Nh. The rotation of the pin holder 368 to the prescribed rotation position is finished before the pin holder 368 holds the holding pin 212. After the movement of the pin holder 368, the pin holder 368 is lowered and then the two grasping fingers 370 are opened to grasp the holding pin 212. After the fingers 370 grasp the holding pin 212, the pin holder 368 is elevated so that the holding pin 212 is taken out of the storing device 340.

Then, at S40, the pin holder 368 is moved to the holding table 210 according to the setting-position data representing the setting position where the holding pin 212 is to be set. Since the holding pin 212 is associated with a prescribed rotation position θ np, the pin holder 368 is rotated during this movement. This rotation is effected based on the rotation position θ np prescribed for the holding pin 212, and the rotation-position error Δθ np obtained from the image taken by the CCD camera 56 when the holding pin 212 is taken out of the storing device 340. Thus, the rotation-position error Δθ np is corrected so that the holding pin 212 may be set at the prescribed rotation position θ np on the holding table 210.

After the movement of the pin holder 368, the control goes to S41 to lower the pin holder 368 and set the holding pin 212 on the holding table 210. More specifically described, the holding pin 212 set on the holding table 210 closely contacts a surface of the upper surface 226 that surrounds the opening of one negative-pressure-supply hole 224 and, as described previously, the holding pin 212 is magnetically attracted to, and fixed to, the holding table 210. Thus, the negative-pressure passage 326 is communicated with the negative-pressure-supply hole 224. After the holding pin 212 is set, the two grasping fingers 370 are opened to release the holding pin 212, and then the pin holder 368 is elevated.

After the holding pin 212 is set on the holding table 210, the control goes to S42 where the holding-pin storing address Nh is incremented by one and then, the control goes to S54 to judge whether all the holding and closing pins 212, 330 have been set on the holding table 210. This judgment is made by, e.g., judging whether the pin number np is equal to the total pin number $np_{max}$. The judgment at S54 is negative till all the holding and closing pins 212, 330 are set on the holding table 210, and the control goes to S55 to increment the pin number np by one, and then goes back to S32.

If the next pin having the next number np is a closing pin 330, a negative judgment is made at S33, and the control goes to S44 and the following steps. It does not matter with the rotation position of each closing pin 330 itself. Therefore, each closing pin 330 is set on the holding table 210 like each holding pin 212 is set, except that for the closing pin 330, no actions are taken in connection with rotation position θ np or rotation-position error Δθ np. More specifically described, when the pin holder 368 grasps each closing-pin 124 stored in the closing-pin storing area 344, the pin holder 368 is rotated to a prescribed rotation position at which the direction of arrangement of the two grasping fingers 370 is parallel to the X-axis direction. Thus, the pin holder 368 can grasp each closing pin 330, without interfering the closing pins 212, 330 adjacent thereto. Then, while the pin holder 368 holding each closing pin 330 is moved to the prescribed setting position on the holding table 210, the pin holder 368 is rotated according to the rotation-position data representing the prescribed rotation position at which the two grasping fingers 370 are opposed to each other in a prescribed direction which assures that the fingers 370 can set each closing pin 330 on the holding table 210, without interfering with the holding and/or closing pins 212, 330 already set adjacent thereto. The closing pin 330 is set at a prescribed closing position on the upper surface 226 of the holding table 210 to close one of the negative-pressure-supply holes 224 to which the holding pins 212 are not attached and thereby prevent the leakage of negative pressure. S32 to S42, S44 to S52, S54, and S55 are repeated till all the holding and closing pins 212, 330 are set on the holding table 210. If all the programmed holding and closing pins 212, 330 are set on the holding table 210, a positive judgment is made at S54, and this routine is finished.

As is apparent from the foregoing description of the present embodiment, the PWB holding device 174 can be automatically reset without needing any interventions of the operator. Therefore, the holding device 174 can be reset at an improved speed, i.e., more quickly. Since both the holding pins 212 to hold the PWB 24, and the closing pins 330 to close the negative-pressure-supply holes 224 to which the holding pins 212 are not attached, are automatically attached, the PWB holding device 174 which supports the desired portions of the PWB 24 at the desired distance from the holding table 210 can be easily and quickly obtained. Since the PWB holding device 174 can be reset in a short time, the EC mounting system 12 can be operated at an improved efficiency. Moreover, when each of the holding pins 212 and the closing pins 330 is set on the holding table 210, the pin holder 368 is mechanically moved by the X-Y robot 48 according to the setting-position data prepared in advance for the each pin 212, 330. In contrast, in the case where the holding and closing pins 212, 330 are set on the holding table 210 by different operators, the pins 212, 330 may be set at different positions owing to respective individualities of the different operators. That is, since in the present embodiment the holding and closing pins 212, 330 are accurately set at the prescribed positions, the quality of the PWB holding device 174 is improved. Furthermore, since the resetting operation is automated, the time needed for the operator to intervene in the resetting operation is minimized. Thus, the efficiency of the resetting operation is improved, and the frequency of occurrence of errors resulting from the operator's interventions is minimized. In addition, since the resetting apparatus shares the X-Y robot 48 with the EC mounting device 16, the resetting apparatus can be produced at reduced cost, and the EC mounting system 12 can enjoy a simplified construction.

As is apparent from the foregoing description of the present embodiment, the holding head 362 provides not only a first holding head but also a second holding head. The EC mounting head 30 provides an operation performing head; the EC mounting device 18 provides an operation performing device; and the X-Y robot 48 and the elevating and lowering device 52 cooperate with each other to provide an operation-relating moving device. The X-Y robot 48 and the elevating and lowering device 366 cooperate with each other to provide not only a first moving device but also a second moving device. The elevating and lowering device 52 elevates and lowers the EC mounting head 30 relative to the PWB holding device 174 holding the PWB 24, in directions perpendicular to the upper surface 226 as a surface of the holding table 210; and the elevating and lowering device 366 elevates and lowers the holding head 362 relative to the holding table 210 and the support table of the storing device 340, in directions perpendicular to the upper surface 226 and the support surface of the support table of the storing device 340. The X-Y robot 48 moves the holding head 362 relative to the storing device 340 and the holding table 210, in directions parallel to the upper surface 226, on one hand, and moves, on the other hand, the EC mounting head 30 relative to the PWB holding device 174 in directions parallel to the upper surface 226 of the holding table 210. Thus, the first and second moving devices share the X-Y robot 48. Moreover, each of the holding pins 212 has the function of supporting the PWB 24 and accordingly provides a supporting member.

In the illustrated embodiment, the resetting of the PWB holding device 174 is performed in the EC mounting system 12. However, it is possible to reset a PWB holding device outside an EC mounting system, as will be illustrated in another embodiment shown in FIGS. 19 to 22.

The second embodiment relates to an automatic resetting apparatus 600 which is provided outside an EC mounting system, i.e., independent of the same. This EC mounting system has substantially the same construction as that of the EC mounting system 12 shown in the first embodiment, except that the former EC mounting system is not provided with an automatic resetting apparatus. Accordingly, the illustration and description of the former EC mounting system are omitted, and the same names and reference numerals as used in the first embodiment are used to designate the counterparts of the second embodiment that have the respective same functions.

Figure 20:
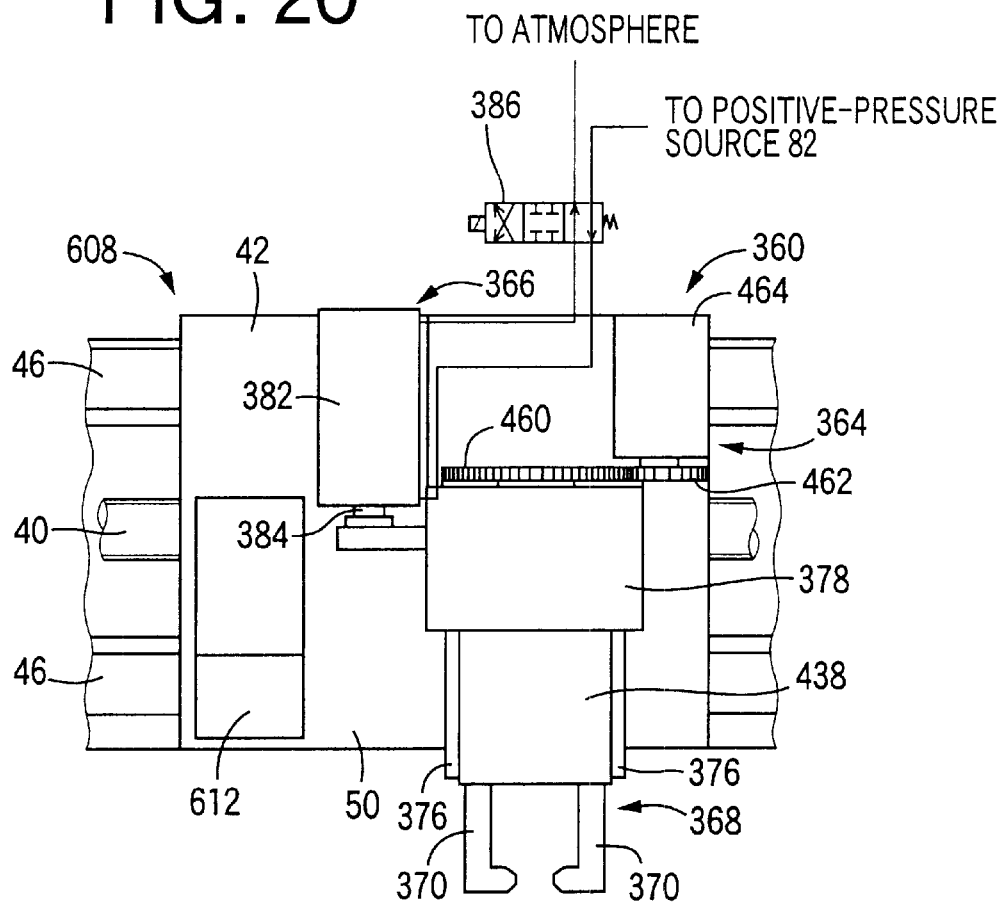
FIG. 20 is a side elevation view of a holding unit of the automatic resetting apparatus of FIG. 19.

The automatic resetting apparatus 600 includes a base 602 as a main frame; a pin-storing device (hereinafter, referred to as the storing device) 604; a holding unit 606; an X-Y robot 608; and a holding-table holding device 610. The holding unit 606 and the X-Y robot 608 have the respective same constructions as those of the holding unit 360 and the X-Y robot 48 of the first embodiment. Accordingly, the same reference numerals as used in the first embodiment are used to designate the counterparts of the second embodiment that have the respective same functions, and the description thereof is omitted. As shown in FIG. 20, on a Y-axis table 42 as part of the X-Y table 608, a CCD camera 612 as an image-taking device is provided such that the CCD camera 612 is oriented downward so as to be able to take an image of a fiducial mark and a fiducial line of each of holding pins, not shown, and an image of a fiducial mark of each of closing pins, not shown. The holding pins and the closing pins employed in the second embodiment have the respective same constructions as those of the holding pins 212 and the closing pins 330 employed in the first embodiment.

The storing device 604 and the holding-table holding device 610 are provided, on the base 602, in a space present between two ball screws 34 as part of the X-Y robot 608. The storing device 604 has the same construction as that of the storing device 340 employed in the first embodiment, and has a holding-pin storing area and a closing-pin storing area for storing a plurality of holding pins and a plurality of closing pins, respectively. The storing device 604 stores the holding pins and the closing pins that are enough to reset each of a plurality of PWB holding devices 638.

Figure 21:
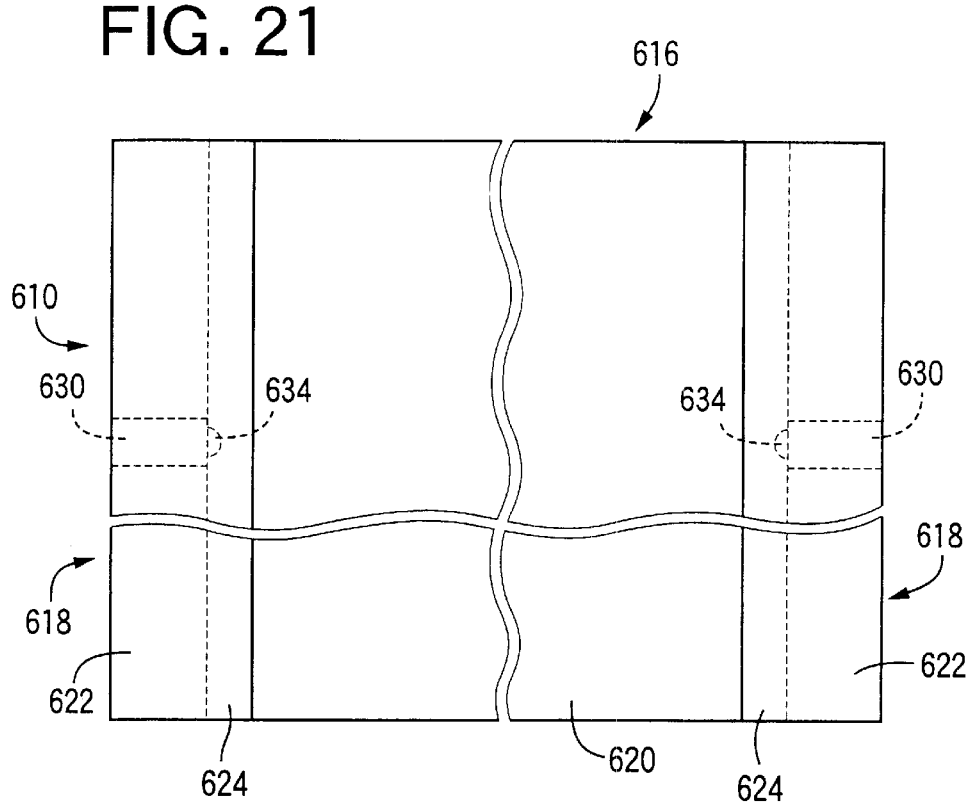
FIG. 21 is a plan view of a holding-table holding device of the automatic resetting apparatus of FIG. 19.
Figure 22:
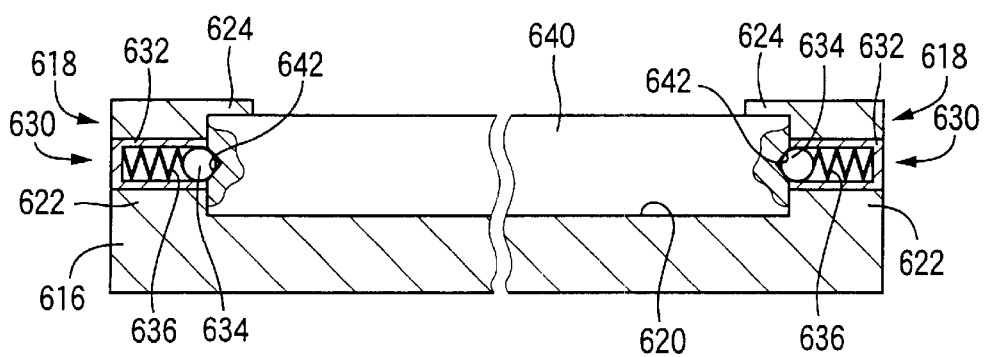
FIG. 22 is a partly cross-sectioned, front elevation view showing a state in which a holding table of a PWB holding device is set on the holding-table holding device of FIG. 21.

The holding-table holding device 610 is provided adjacent to the storing device 604 in the X-axis direction and, as shown in FIGS. 21 and 22, includes a holding frame 616. The holding frame 616 is fixed to the base 602 such that the holding frame 616 extends horizontally, and includes two guides 618 at opposite ends thereof in the X-axis direction. Each one of the two guides 618 includes a rail portion 622 projecting upward from an upper surface 620 of the holding frame 616; and a hold-down portion 624 projecting from an upper end of the rail portion 622 toward a rail portion 622 of the other guide 618, in a direction parallel to the upper surface 620.

The rail portion 622 of each of the two guides 618 is provided with a holder 630. The holder 630 includes a ball 634 that is provided in a casing 632 such that the ball 634 is movable relative to the casing 632; and a spring 636 as a biasing device that biases the ball 634 in a direction in which the ball 634 advances out of the casing 632. The casing 632 has an opening in a side surface thereof, and the opening has a diameter smaller than that of the ball 634. Thus, the ball 634 is prevented from coming off the casing 632.

A PWB holding device 638 includes a holding table 640. The holding table 640 has such a size that assures that the holding table 640 can hold each of a plurality of sorts of PWBs having respective sizes. The holding frame' 616 has such a size that can hold the holding table 640. As shown in FIG. 22, the holding table 640 has, in each of opposite side surfaces thereof parallel to the Y-axis direction, a notch 642 as an engageable recess that has a V-shaped cross section. The notch 642 has a conical inner surface. The PWB holding device 638 employed in the second embodiment has the same construction as that of the PWB holding device 174 employed in the first embodiment. The holding table 640 has a plurality of negative-pressure-supply holes, not shown. Some holding pins having respective negative-pressure passages are attached to some of the negative-pressure-supply holes, and some closing pins are used to close the other, remaining negative-pressure- supply holes.

The automatic resetting apparatus 600 is controlled by a control device 650 which is essentially provided by a computer including a RAM in which a plurality of batches of pin-setting information are stored, and a ROM in which a pin-storing routine and a pin-setting routine are stored.

The EC mounting system includes a PWB elevating and lowering device, not shown, including a PWB lifter, not shown. On the PWB lifter, a holding-table holding device identical with the holding-table holding device 610 is provided so as to hold the holding table 640 as the holding device 610 does. Thus, the PWB holding device 638 can be set on the PWB lifter.

The automatic resetting apparatus 600 is provided outside the EC mounting system. Therefore, the apparatus 600 can reset the PWB holding device 638, at an arbitrary timing, irrespective of the current state of the EC mounting system, e.g., when the mounting system is mounting ECs on a PWB, or when the mounting system is not mounting ECs. In addition, the apparatus 600 can successively reset a plurality of PWB holding devices 638, so that each of the PWB holding devices 638 is ready for use on the PWB lifter of the EC mounting system.

When a PWB holding device 638 whose holding table 640 having holding pins and closing pins (not shown) is reset, first, the operator attaches the holding device 638 to the holding-table holding device 610. More specifically described, the operator manually attaches the holding table 640 to the holding device 610, by inserting the holding table 640 into the holding frame 616 through one of opposite ends thereof as seen in the Y-axis direction, that is, fitting opposite end portions of the holding table 640 that are parallel to the Y-axis direction, in respective spaces between the respective hold-down portions 624, and the upper surface 620, of the holding frame 616, and advancing the table 640 into the frame 616. In a state in which the PWB holding device 638 is not held by the holding frame 616, the respective balls 634 of the holders 630 are partly projected, owing to the respective biasing forces of the springs 636, out of the respective casings 632, i.e., respective inner side surfaces of the rail portions 622. Therefore, the holding table 640 is fitted in the holding frame 616, while pressing the balls 634 into the casings 632 against the biasing forces of the springs 636. When the notches 642 provided in the side surfaces of the holding table 640 are aligned with the holders 630, respectively, the balls 634 fit in the notches 642. Each of the balls 634 engages a circular portion of the inner surface of a corresponding one of the notches 642, so that the holding table 640 is positioned and held in both the X-axis and Y-axis directions.

After the PWB holding device 638 is attached to the holding frame 616, the automatic resetting apparatus 600 starts a resetting operation, in response to a command input by the operator. Like in the first embodiment, the X-Y robot 608 and others are operated to move the holding unit 606 to detach all the holding and closing pins from the holding table 640 and store those pins in the storing device 604 and subsequently take necessary holding and closing pins from the storing device 604 and set those pins at respective setting and closing positions on the holding table 640.

Holding pins and closing pins are stored and set according to a pin-storing routine and a pin-setting routine, and pin-setting information to set the holding pins and the closing pins. To this end, the operator inputs, into the computer of the control device 650, data designating the pin-setting information used to store the holding and closing pins that are currently set on the holding table 640, and the pin-setting information used to set the holding and closing pins that are to be next set on the holding table 640. The above-indicated data may be data representing respective sorts of PWBs held by the PWB holding device 638, or data representing respective sorts of manufacturing programs used to mount ECs on respective sorts of PWBs held by the PWB holding device 638. Data designating pin-setting information, and the pin-setting information are stored, in association with each other, in the RAM of the computer.

The pin-storing routine and the pin-setting routine may be identical with those employed in the first embodiment. However, the storing device 604 stores a large number of holding pins and a large number of closing pins that are sufficient for resetting a plurality of PWB holding devices 638, and the number of pins absent from the storing device 604 may not be equal to the number of pins present on the holding table 640, unlike the case where the automatic resetting operation is performed inside the EC mounting system. Accordingly, after the pin-storing and pin-setting routines have been finished, the respective storing addresses where the two routines have been finished are utilized to determine an initial value to be used in the pin-storing routine and an initial value to be used in the pin-setting routine, and the thus determined addresses are stored in the RAM so that the stored addresses are ready for use in carrying out the two routines at the next time. The storing address where the pin-storing routine has been finished is the smallest address of the address range from which the pins are present; and the storing address where the pin-setting routine has been finished is the largest address of the address range in which the pins are present. Therefore, when the pin-storing routine is finished, the storing address at that time is employed, at S31, as an initial value for the pin-setting routine, and an address smaller by one than the address at that time is employed, at S1, as an initial value for the pin-storing routine; and when the pin-setting routine is finished, the storing address at that time is employed, at S1, as an initial value for the pin-storing routine, and an address greater by one than the address at that time is employed, at S31, as an initial value for the pin-setting routine. Those initial values are stored in the RAM and are used in carrying out the routines. However, when the operator manually stores holding pins and closing pins in the storing device 604, the operator inputs those initial values, and the input values are stored in the RAM.

After one PWB holding device 638 has been reset, the operator detaches the one PWB holding device 638 from the holding-table holding device 610, by drawing the holding table 640 from the holding frame 616. At this time, the balls 634 are forcedly retracted, owing to the respective forces exerted thereto by the respective inner surfaces of the notches 642, into the respective casings 632 against the respective biasing forces of the springs 636, so that the holding table 640 is allowed to be drawn out of the holding frame 616. If another PWB holding device needs resetting, the operator sets the second PWB holding device 638 on the holding-table holding device 610.

When the EC mounting system is reset after having completed the mounting of ECs on PWBs according to the current manufacturing program, the operator replaces the PWB holding device 638 present in the EC mounting system, with a second PWB holding device 638 that is to hold PWBs on which ECs are to be mounted according to the next manufacturing program. The resetting of the second PWB holding device 638 had been finished by the automatic resetting apparatus 600, before the EC mounting system completes the mounting of ECs according to the current program.

The operator exchanges the two PWB holding devices 638 with each other, at a place on one side of the PWB supporting and conveying device 20 that is opposite to the EC supplying device 18 in the Y-axis direction. First, the PWB lifter 176 is lowered so that the current PWB holding device 638 is lowered to its downward-movement-end position where the PWB holding device 638 is detached from the holding-table holding device provided on the PWB lifter. This detaching is carried out in the same manner as that in which each PWB holding device 638 is detached from the holding-table holding device 610, that is, each device 638 is horizontally moved and separated from the device 610. Then, the PWB holding device 638 is moved away from the EC mounting system 12 through the recess 200 of the movable guide 190 of the PWB conveyor 22. After the detaching, a new PWB holding device 638 is attached to the holding-table holding device provided on the PWB lifter. The operator uses his or her hands to support the new device 638 and attach the device 638 to the holding-table holding device on the PWB lifter through the recess 200 of the movable guide 190.

Each of the PWB holding devices 638 is attached to, and detached from, each of the base 10 of the EC mounting system and the base 602 of the automatic resetting apparatus 600 provided outside the system. The attaching and detaching can be easily and quickly carried out by just moving each PWB holding device 638 relative to the holding frame 616 of the holding-table holding device 610, in a time shorter than a time needed for an automatic resetting apparatus employed in an EC mounting system to reset a PWB holding device inside the system. Therefore, the advantage that each automatic PWB-holding-device resetting operation can be done in a short time is not damaged, and the efficiency of operation of the EC mounting system can be improved.

The storing of the holding pins and the closing pins in the storing device 604 may be carried out by the operator. In this case, only the setting of the pins on the holding table 640 is automatically carried out by the automatic resetting apparatus 600, which may be called as a pin setting apparatus. Alternatively, only the storing of the pins in the storing device 604 may be automatically carried out by the automatic resetting apparatus 600, which may be called as a pin storing apparatus.

At least one of the attaching and detaching of each PWB holding device 638 to and from the automatic resetting apparatus 600, or at least one of the attaching and detaching of each PWB holding device 638 to and from the EC mounting system may be automatically carried out by an automatic exchanging device or an automatic attaching and detaching device.

In the case where the holding table 640 has such a size which assures that the table 640 can hold a plurality of sorts of PWBs having different sizes, the table can be used commonly for holding the different sorts of PWBs. However, in the case where the automatic resetting apparatus 600 provided outside the EC mounting system is used to reset PWB holding devices, the respective holding tables of the PWB holding devices may have respective sizes corresponding to respective sizes of different sorts of PWBs. On the other hand, in the case where the automatic resetting apparatus 374 is employed inside the EC mounting system 12, different sorts of holding tables 210 having respective sizes corresponding to respective sizes of different sorts of PWBs may be used by being automatically exchanged with each other.

In each of the illustrated embodiments, when each holding pin 212 is stored, it is judged, at S8, whether the rotation-position error $\Delta\theta$ np of the pin 212 falls within the permission range, before the pin 212 is grasped; and when each holding pin 212 is set, it is judged, at S38, whether the rotation-position error $\Delta\theta$ np of the pin 212 falls within the permission range, before the pin 212 is grasped. However, at least one of those two steps may be omitted.

In each of the illustrated embodiments, respective images of all the supporting members 212, 330 set on the supporting table 210, 640 may be taken before each of the supporting members is detached from the supporting table; and respective images of all the supporting members 212, 330 stored in the storing device 340, 604 may be taken before each of the supporting members is taken out of the storing device.

In each of the illustrated embodiments, the holding and closing pins 212, 330 are magnetically fixed to the holding table 210, 640, and the permanent magnets 328, 338 of the pins 212, 330 and the base 218 which is formed of a ferromagnetic material cooperate with each other to provide a fixing device. However, the fixing device may be one which fixes the supporting members such as the holding and closing-pins 212, 330, to the supporting table 210, 640, owing to a non-magnetic force. The fixing device may be one which allows the supporting members 212, 330 to be automatically and iteratively attached to, and detached from, the supporting surface 226 of the supporting table 210, 640. Preferably, the fixing device fixes and releases the supporting members 212, 330 to and from the supporting surface 226, by moving at least one of each supporting member and the supporting surface relative to the other in directions perpendicular to the supporting surface, in directions parallel to the supporting surface, or in directions intersecting the supporting surface. For example, the fixing device may be provided by two fastening members, such as so-called magic tapes, which are provided on the supporting surface and the seat surface 329, 338 of each supporting pin 212, 330, respectively, and which engage and fasten each other; or two tacky layers which are provided on the supporting surface and the seat surface 329, 338 of each supporting pin 212, 330, respectively.

In each of the illustrated embodiments, the pin 286 of each holding pin 212 may be connected to one of the lengthwise opposite end portions of the elongate seat member 320 thereof.

After holding and closing members 212, 330 are set on the supporting table 210, 640, an image of each member 212, 330 may be taken and, based on the taken image, positional errors of the each member in directions parallel to the supporting surface 226 may be calculated. If each holding or closing member is associated with a prescribed rotation position, a rotation-position error of the supporting member may additionally be calculated. The calculated positional errors and/or rotation-position error are compared with respective reference amounts and, if at least one of the errors is greater than a corresponding one of the reference amounts, the occurrence of abnormality is informed. This may be carried out each time one holding or closing member is set on the supporting surface, or after all the members are set on the supporting surface. Likewise, after holding and closing members 212, 330 are stored in the storing device 340, 604, an image of each member 212, 330 may be taken and, based on the taken image, positional errors of the each member in directions parallel to the support surface of the storing device may be calculated. If each holding or closing member is associated with a prescribed rotation position, a rotation-position error of the each member may additionally be calculated. The calculated positional errors and/or rotation-position error are compared with respective reference amounts and, if at least one of the errors is greater than a corresponding one of the reference amounts, the occurrence of abnormality is informed. The reference amounts employed for the holding and closing members stored in the storing device may be greater than those employed for the members set on the supporting table. That is, the criterion used to find abnormality with the position of each member stored in the storing device may be less strict than that used to find abnormality with the position of each member set on the supporting table. This is true with the case where a PWB is supported by supporting members which do not have the function of sucking and holding a PWB.

In the first embodiment in which the automatic resetting apparatus 374 is employed in the EC mounting system 12, the holding unit 360 and others are provided on the Y-axis table 42, so that, when the ECs 32 are mounted on the PWB 24, the holding unit 360 is moved together with the suction nozzle 60. However, the holding unit 360 may be modified such that the holding unit 360 is moved by the X-Y robot 48 only when the resetting operation is performed, and such that when the ECs 32 are mounted on the PWB 24, the holding unit 360 waits at a waiting position or shelters to a sheltering position. For example, the holding unit 360 may be provided on a table different from a table on which the EC mounting head 30, the rotating device 50, the elevating and lowering device 52, and others are mounted, and respective connection portions of the two tables may be connected to, and disconnected from, each other. The two tables may additionally include respective air-supply portions which are for supplying a positive-pressure air to the elevating and lowering device 366 and others. In this case, when the respective connection portions of the two tables are connected to each other, the respective air-supply portions of the two tables are simultaneously connected to each other.

The Y-axis table 42 on which the suction nozzle 60 and others are provided is never detached from the X-axis table 36, and a third table on which the holding unit 360 is provided is detached from the X-axis table 36 when the ECs 32 are mounted on the PWB 24, so that the third table waits at the waiting position. The waiting position may be a position adjacent, in the Y-axis direction, to the X-axis table 36 being positioned at its origin position. When the X-axis table 36 is returned to the origin position for the resetting operation, the third table on which the holding unit 360 is provided is connected to the Y-axis table 42 on which the EC mounting head 30 and others are mounted, so that the holding unit 360 is moved by the X-Y robot 48. After the supporting members 212, 330 are set on the holding table 210, the X-axis table 36 is moved to the origin position, so that the third table on which the holding unit 360 is provided is disconnected from the Y-axis table 42 on which the mounting head 30 and others are provided, and waits at the waiting position. The Y-axis table 42 having the thus reduced weight is used for the EC mounting operation.

In each of the illustrated embodiments, the resetting operation is performed such that first, all the holding and closing pins 212, 330 currently set on the holding table 210 are all detached from the holding table and then, the holding and closing pins needed to hold a new sort of PWB are set on the holding table. However, in the case where the positions and phases of some of the current holding and closing pins are common with those of some of the new holding and closing pins, those common pins may be left on the holding table. In this case, only the other, current holding and closing pins are detached from the holding table, and only the other, new holding and closing pins are set on the holding table.

In the second embodiment shown in FIGS. 19 to 22, the ball 634 of each of the holders 630 engages a circular portion of the inner surface of a corresponding one of the notches 642, to position the holding table 640. However, it is possible to employ a stopper which defines a limit of movement of the holding table 640 relative to the holding frame 616, such that, at the limit of movement, each of the balls 634 engages only a stopper-side half portion of the inner surface of a corresponding one of the notches 642 and a small space is left between the each ball 634 and the other half portion of the inner surface. Since the each ball 634 engages, while being biased by the spring 636, the inclined inner surface of the corresponding notch 642, the each ball 634 pushes the holding table 640 against the stopper and thereby positions the same 640, owing to the effect of inclination and the biasing action of the spring 636.

In the first embodiment in which the automatic resetting apparatus 374 is employed in the EC mounting system 12, the resetting apparatus may be one which does not share any elements, e.g., the X-Y robot 48, with the EC mounting device 16, i.e., is independent of the EC mounting device 16.

In each of the illustrated embodiments, the storing device 340, 604 stores the holding pins 212 and the closing pins 330 in respective different areas. However, the storing device 340, 604 may stores the holding pins 212 and the closing pins 330 in a mixed manner. In this case, if each of the holding and closing pins 212, 330 is associated with a prescribed storing position and a prescribed setting position, the each pin 212, 330 can be taken out of the storing device to be set on the holding table 210, 640 to hold a PWB 24 or close a negative-pressure-supply hole 224, and can be detached from the holding table and stored in the storing device.

In each of the illustrated embodiments, the pin-storing information is input by the operator, and the input information is utilized by the control device 500, 650 to store and set the holding pins 212 and the closing pins 330. However, the pin-storing information may be dealt with independent of the pin-setting information. For example, the pin-storing information may be exclusively dealt with by a pin-storing control device belonging to the storing device 340, 604. When a holding or closing member 212, 330 set on the supporting table 210, 640 needs to be stored in the storing device 340, 604, a portion of the control device 500, 650 that controls the movement of the holding head 362 of the EC mounting system 12 or the resetting apparatus 600 requests the pin-storing control device to teach the position where the holding or closing member is to be stored, and stores the holding or closing member at the taught position. Meanwhile, when a holding or closing member 212, 330 needs to be set on the supporting table 210, 640, the control device 500, 650 requests the pin-storing control device to teach the position where the holding or closing member is stored in the storing device 340, 604, and takes the holding or closing member from the taught position to set the same on the supporting table. Thus, the holding and closing members 212, 330 stored in the storing device 340, 604 are managed by the pin-storing control device, independent of the sorts of the PWBs 24 on which the ECs 32 are mounted. However, it is not needed to physically separate the pin-storing control device from the control device 500, 650 that controls the EC mounting system 12 or the resetting apparatus 600, that is, the pin-storing control device may be provided by part of the control device 500, 650.

[0165] In each of the illustrated embodiments, the PWB holding device 174, 638 is one which includes the holding pins 212 that suck and hold, and thereby support, the PWB 24. However, the PWB holding device may be one which includes at least one holding pin having the sucking and holding function, and at least one supporting pin not having the function, both of which are set on a holding table to support the PWB 24. In the latter case, too, at least one closing pin 330 is used to close at least one negative-pressure-supply hole 224 to which no holding pin 212 is attached. The closing pin or pins may be provided by the supporting pin or pins.

The PWB supporting device may be one which includes supporting members each of which does not have the sucking-and-holding function and supports, at a support surface thereof, a back surface of a PWB. The supporting members may be provided by supporting pins each of which does not have any of the negative-pressure passage 326, suction cup 310, and elongate seat member 320 of each holding pin 212.

At least a portion of each of the holding pins 212, the closing pins 330, and the supporting pins that is to engage the holding or supporting table 210, 640 may be formed of a ferromagnetic material, and the holding or supporting table 210, 640 may be formed of a permanent magnet. In this case, the support table of the storing device 340, 604 may be formed of a permanent magnet.

In each of the illustrated embodiments, the PWB clamping device 172 includes the respective clamping plates which are movably provided on the fixed and movable guides 188, 190, and the respective clamping cylinders which move the respective clamping plates toward the PWB hold-down portions 194 so that the clamping plates cooperate with the hold-down portions 194 to clamp the opposite end portions of the PWB 24. However, the clamping plates may be modified such that when the PWB holding device 174 is moved upward, the clamping plates are engaged with the holding table 210; as the holding table is moved upward, the clamping plates are moved toward the PWB hold-down portions 194 against the biasing action of the springs; and finally, the clamping plates cooperate with the hold-down portions 194 to clamp the PWB 24.

The clamping plates of the PWB clamping device 172 may be provided on the holding table. For example, two clamping plates are provided on opposite end portions of the holding table, respectively, that extend parallel to the PWB-convey direction, such that the clamping plates stand upright. Each holding pin 212 should have such a height which assures that an upper end surface thereof is positioned on the same plane as that on which respective upper end surfaces of the clamping plates are positioned. When the PWB holding device 174 is moved upward, the holding pins 212 suck and hold the PWB 24, the clamping plates support the lower surface of the PWB 24, and cooperate with the PWB hold-down portions 194 to sandwich the opposite end portions of the PWB 24. The distance between the two clamping plates may be changed by a width changing device according to a width of the PWB 24. Alternatively, the holding table 210 which has a size corresponding to a size of the current PWB 24 and is provided with a pair of clamping plates whose distance corresponds to the size of the current PWB 24, may be replaced with a new holding table which has a size corresponding to a size of a new sort of PWB 24 and is provided with a pair of clamping plates whose distance corresponds to the size of the new PWB 24.

While the present invention has been described in its preferred embodiments, it is to be understood that the present invention is not limited to the details of those embodiments but may be embodied with other changes and improvements, such as those described in SUMMARY OF THE INVENTION, that may occur to a person skilled in the art without departing from the spirit and scope of the invention defined in the appended claims.

What is claimed is:

1. An apparatus for automatically resetting a printed-wiring-board holding device including a holding table having a surface and a plurality of negative-pressure-supply holes opening in the surface, and additionally including a plurality of holding members each of which has a support surface and a negative-pressure passage formed therethrough and is set on the surface of the holding table to support, at the support surface thereof, a back surface of a printed wiring board, and apply a negative pressure supplied through the negative-pressure passage thereof from at least one of the negative-pressure-supply holes, to the back surface of the printed wiring board and thereby hold the board, the apparatus comprising:

a holding-member storing device in which the holding members are stored;

a first holding head which holds each of the holding members;

a first moving device which moves at least one of the first holding head, and each of the holding table and the holding-member storing device, relative to the other of the first holding head and said each of the holding table and the holding-member storing device, in at least a direction parallel to the surface of the holding table, so that the first holding head takes a prescribed one of the holding members from the holding-member storing device and sets said one holding member at a prescribed setting position on the surface of the holding table, and takes said one holding member from the setting position and stores said one holding member in the holding-member storing device;

a plurality of closing members each of which is set on the surface of the holding table and closes one of the negative- pressure-supply holes that is not communicated with the negative-pressure passages of any holding members;

a closing-member storing device in which the closing members are stored;

a second holding head which holds each of the closing members;

a second moving device which moves at least one of the second holding head, and each of the holding table and the closing-member storing device, relative to the other of the second holding head and said each of the holding table and the closing-member storing device, in at least a direction parallel to the surface of the holding table, so that the second holding head takes a prescribed one of the closing members from the closing-member storing device and sets said one closing member at a prescribed closing position on the surface of the holding table where said one closing member closes a prescribed one of the negative-pressure-supply holes that is not communicated with the negative-pressure passages of any holding members, and the second holding head takes said one closing member from the closing position and stores said one closing member in the closing-member storing device; and a control device which controls the first moving device so that the first holding head takes said one holding member from the holding-member storing device and sets said one holding member at the setting position, and takes said one holding member from the setting position and stores said one holding member in the holding-member storing device, and controls the second moving device so that the second holding head takes said one closing member from the closing-member storing device and sets said one closing member at the closing position, and takes said one closing member from the closing position and stores said one closing member in the closing- member storing device.

2. The apparatus according to claim 1, wherein the first and second holding heads comprise a common holding head and the first and second moving device comprise a common moving device.

3. The apparatus according to claim 1, wherein the closing-member storing device and the holding-member storing device comprise a common storing device.

4. The apparatus according to claim 1, further comprising a holding-table holding device which holds the holding table such that the holding table is detachable therefrom.

* * * * *